United States Patent
Kanzaki

(10) Patent No.: US 9,627,298 B2
(45) Date of Patent: Apr. 18, 2017

(54) SEMICONDUCTOR DEVICE

(71) Applicant: Renesas Electronics Corporation, Tokyo (JP)

(72) Inventor: Teruaki Kanzaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/938,921

(22) Filed: Nov. 12, 2015

(65) Prior Publication Data
US 2016/0225698 A1 Aug. 4, 2016

(30) Foreign Application Priority Data

Feb. 3, 2015 (JP) ................. 2015-019293

(51) Int. Cl.
*H01L 23/495* (2006.01)
(52) U.S. Cl.
CPC *H01L 23/4952* (2013.01); *H01L 2224/48247* (2013.01)
(58) Field of Classification Search
CPC ......... H01L 23/49555; H01L 23/49586; H01L 24/48; H01L 23/49537; H01L 23/495348; H01L 23/49551; H01L 2224/48247; H01L 23/49575; H01L 23/4951; H01L 2924/19105; H01L 23/49568; H01L 2224/49175; H01L 23/50
See application file for complete search history.

(56) References Cited

U.S. PATENT DOCUMENTS

| | | | |
|---|---|---|---|
| 5,646,451 A * | 7/1997 | Freyman | H01L 23/4952 228/180.5 |
| 7,521,918 B2 | 4/2009 | Nishizawa | |
| 2006/0180943 A1* | 8/2006 | Miwa | H01L 25/0657 257/777 |

FOREIGN PATENT DOCUMENTS

JP 2006-134107 A 5/2006

* cited by examiner

*Primary Examiner* — Jasmine Clark
(74) *Attorney, Agent, or Firm* — Mattingly & Malur, PC

(57) ABSTRACT

To enable a semiconductor device excellent in usability to be provided. A semiconductor device has a main surface surrounded by a plurality of sides, a semiconductor chip having a plurality of electrode pads arranged over the main surface, and a plurality of leads coupled to the electrode pads by way of wires respectively. The electrode pads include a plurality of first electrode pads supplied with a plurality of bits temporally in parallel. The first electrode pads include second and third electrode pads. A fourth electrode pad different from the first electrode pads is arranged between the second and third electrode pads.

9 Claims, 9 Drawing Sheets

FIG. 2

| PORT | 120-PIN PACKAGE | 80-PIN PACKAGE | 64-PIN PACKAGE |
|---|---|---|---|
| P0 | 16 BITS | 16 BITS | 14 BITS |
| P1 | 16 BITS | 16 BITS | 14 BITS |
| P2 | 16 BITS | 16 BITS | 12 BITS |
| P3 | 16 BITS | 16 BITS | 14 BITS |
| P4 | 14 BITS | 4 BITS | 2 BITS |
| P5 | 14 BITS | 4 BITS | 2 BITS |
| P6 | 10 BITS | 0 BITS | 0 BITS |
| P7 | 14 BITS | 4 BITS | 2 BITS |

SEMICONDUCTOR DEVICE

CROSS-REFERENCE TO RELATED APPLICATIONS

The disclosure of Japanese Patent Application No. 2015-019293 filed on Feb. 3, 2015 including the specification, drawings and abstract is incorporated herein by reference in its entirety.

BACKGROUND

The present invention relates to a semiconductor device, and particularly to a semiconductor device equipped with a semiconductor chip suitable for providing semiconductor devices different in the number of terminals.

A semiconductor device equipped with a semiconductor chip having electrode pads arranged at peripheral edge portions thereof has been described in, for example, Patent Document 1.

RELATED ART DOCUMENT

Patent Document

[Patent Document 1] Japanese Unexamined Patent Publication Laid-Open No. 2006-134107

SUMMARY

There is a case where in order to achieve type development of each semiconductor device, a semiconductor chip having the same configuration is packaged into packages different from each other in the number of external terminals (pins), which in turn are provided as semiconductor devices. By providing a semiconductor device small in pin number by this type development, the cost of the provided semiconductor device can be reduced.

When the semiconductor device small in pin number is provided, some of the electrode pads arranged at the peripheral edge portions of the semiconductor chip are arranged so as not to be coupled to the pins of the semiconductor device in order to decrease the number of pins. For example, when input/output ports (hereinafter also called ports) at which a plurality of bits are inputted/outputted in parallel by one access are considered, electrode pads corresponding to the respective bits are arranged in the semiconductor chip. In order to reduce the number of pins, the specific electrode pads of the electrode pads corresponding to the respective bits are arranged so as not to be coupled to the pins. When done in this way, omission of pins in the arrangement of the ports occurs in the arrangement of the ports in the semiconductor device small in pin number. This becomes manifest as the number of bits of each port increases.

As a measure, it is considered that selectors or the like are provided in the semiconductor chip and the pins are replaced for each semiconductor device small in pin number. For example, it is considered that the pins of the semiconductor device are used in common for, for example, an input/output port and an analog signal or a high-speed interface circuit. In this case, the input/output port and the analog signal (or high-speed interface circuit) are exchanged with the selectors for each semiconductor device. Doing this enables the commonly-used pins to be used as input/output pins and makes it possible to reduce pin omission. However, there is a risk that the characteristics of the analog signal or the high-speed interface circuit change due to the influence of the selectors. It is thus difficult to perform the above exchange.

Further it is considered that a plurality of ports at each of which pin omission occurs are combined to increase the number of bits for input/output. In this case, however, access of a plurality of times is required and hence the usability of the semiconductor device is degraded.

Although the semiconductor chip having the electrode pads arranged at the peripheral edge portions has been disclosed in Patent Document 1, the type development is not described. Of course, it is not recognized either that the usability of the semiconductor device is degraded by the type development.

An object of the present invention is to provide a semiconductor device excellent in usability.

The above, other objects and novel features of the present invention will become apparent from the description of the present specification and the accompanying drawings.

A summary of a representative one of the inventions disclosed in the present application will be described in brief as follows:

A semiconductor device has a semiconductor chip having a main surface surrounded by a plurality of sides, and a plurality of electrode pads arranged over the main surface, and a plurality of leads coupled to the electrode pads by way of wires respectively. Here the electrode pads include a plurality of first electrode pads supplied with a plurality of bits temporally in parallel. The first electrode pads include second and third electrode pads. A fourth electrode pad different from the first electrode pads is arranged between the second and third electrode pads.

When a semiconductor device small in pin number is provided by type development, the fourth electrode pad arranged between the second and third electrode pads is provided so as not to be coupled to a lead. Since the lead corresponds to each pin of the semiconductor device herein, it is possible to prevent the number of leads (pins) supplied with a plurality of bits temporally in parallel from being reduced. That is, it is possible to reduce pin omission at each input/output port. A semiconductor device excellent in usability can be provided.

An advantageous effect obtained by a representative one of the inventions disclosed in the present application will be described in brief as follows:

It is possible to provide a semiconductor device excellent in usability.

BRIEF DESCRIPTION OF THE DRAWINGS

FIG. 2 is a diagram showing a relationship between ports and packages in the semiconductor device according to the embodiment 1;

DETAILED DESCRIPTION

Figure 1:
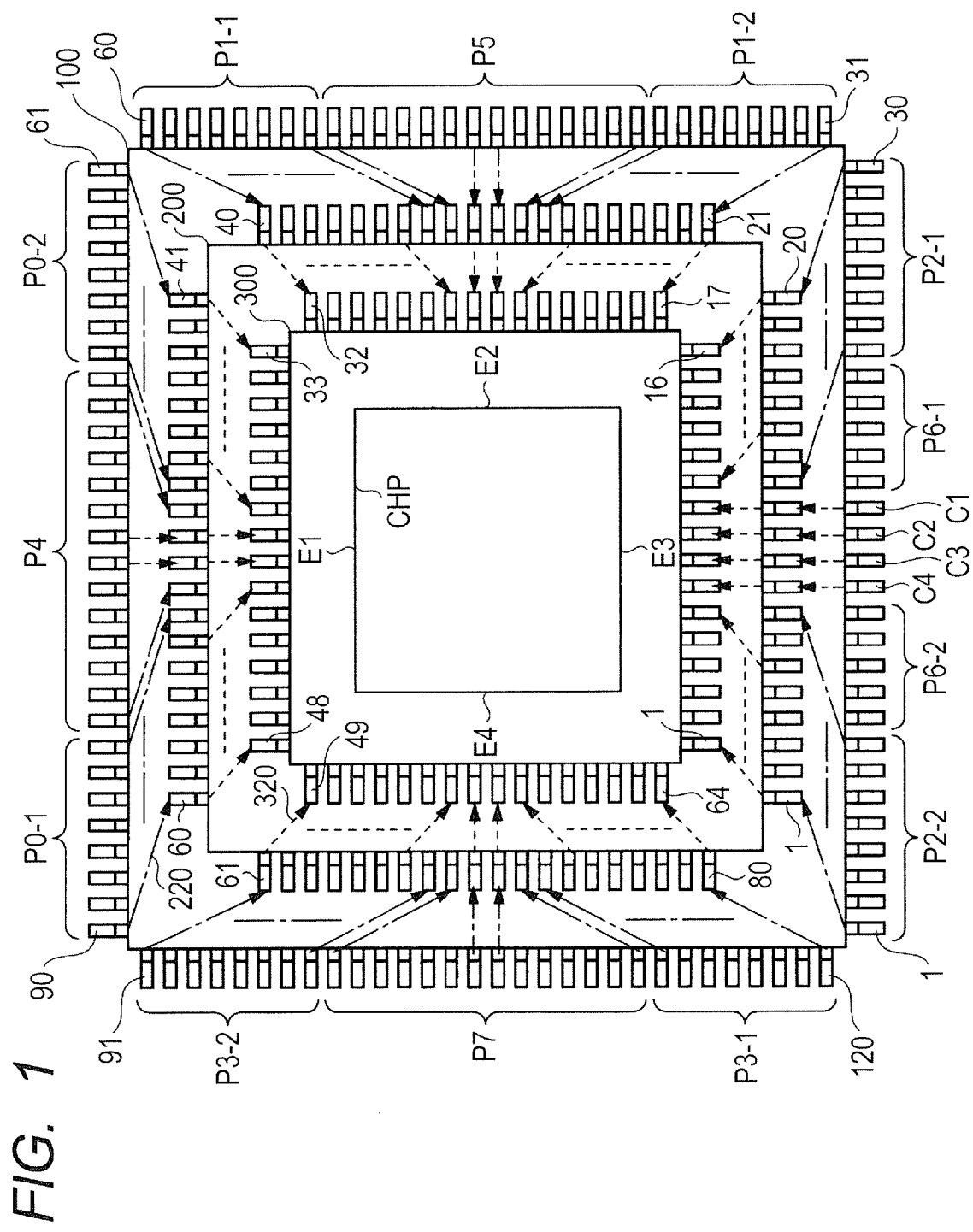
FIG. 1 is a typical plan diagram showing the configuration of a semiconductor device according to an embodiment 1.

Embodiments of the present invention will hereinafter be described in detail based on the accompanying drawings. Incidentally, in all of the drawings for describing the embodiments, the same reference numerals are respectively attached to the same components in principle, and their repetitive description will be omitted in principle.

Embodiment 1

Type Development

FIG. 1 is a typical plan diagram showing the configuration of a semiconductor device according to an embodiment 1. In the same figure, CHP indicates a semiconductor chip. A description will first be made about the type development of the semiconductor chip CHP into semiconductor devices different from each other in the number of pins, using FIG. 1. Here, as the semiconductor devices to be type-developed, a semiconductor device 100 equipped with terminals of 120 pins, a semiconductor device 200 equipped with terminals of 80 pins, and a semiconductor device 300 equipped with terminals of 64 pins will be described as examples. Of course, they are taken as examples, but not limited to these pin numbers.

In the type development, the semiconductor chip CHP is packaged in a package having terminals of 120 pins (packaging) and provided as the semiconductor device 100. Further, the semiconductor chip CHP having the same configuration is packaged in a package having terminals of 80 pins and provided as the semiconductor device 200. The semiconductor chip CHP is packaged in a package having terminals of 64 pins and provided as the semiconductor device 300. Thus, there are provided the semiconductor devices 100, 200, and 300 which respectively include the semiconductor chip CHP having the same configuration and which are respectively different from each other in pin number like 120 pins, 80 pins, and 64 pins.

When the type development is performed using the semiconductor chip CHP having the same configuration, the semiconductor chip CHP is designed according to, for example, a semiconductor device largest in pin number. Since the semiconductor device 100 largest in pin number is equipped with the terminals of 120 pins in FIG. 1, the semiconductor chip CHP is designed according to the terminals of 120 pins. That is, the semiconductor chip CHP is designed so as to include a plurality of electrode pads respectively corresponding to the terminals of 120 pins. These electrode pads are arranged over a main surface of the semiconductor chip CHP. When the semiconductor chip CHP is packaged in the package, the electrode pads arranged over the main surface of the semiconductor chip are electrically coupled to their corresponding pins.

Incidentally, in the semiconductor chip CHP, electrode pads more than the number of pins of the semiconductor device largest in pin number may be provided over its main surface. In this case, some electrode pads are not coupled to the pins of the semiconductor device and used in, for example, a process or the like of a test before the semiconductor chip CHP is packaged in the package. Further, the number of the electrode pads arranged over the main surface of the semiconductor chip CHP may be smaller than the number of the pins of the semiconductor device. In this case, some electrode pads are coupled to, for example, a plurality of pins of the semiconductor device.

Each of the semiconductor devices 100, 200, and 300 has four sides, which are respectively provided with pins. In the semiconductor device 100, 30 pins are provided at the respective sides thereof, and 120 pins are provided as a whole. Likewise, in the semiconductor device 200, 20 pins are provided at the respective sides thereof, and 80 pins are provided as a whole. In the semiconductor device 300, 16 pins are provided at the respective sides thereof, and 64 pins are provided as a whole. In the same figure, reference numerals are respectively attached only to the pins provided at the ends of the sides to avoid the complication of the drawing. For example, when the semiconductor device 100 is taken as an example, codes of numbers are attached only to the pins of number 1, number 30, number 31, number 60, number 61, number 90, number 91, and number 120 of the 120 pins provided in the semiconductor device 100. The semiconductor devices 200 and 300 are also similar to the above. Although not restricted in particular, the numbers of the pins are attached to increase counterclockwise from the lower left of the same figure as seen in plan view.

In FIG. 1, each of the semiconductor devices 100, 200, and 300 can be assumed to be a package for packaging the semiconductor chip CHP. When seemed in this way, the pins can be considered to be the pins for each package. By coupling the pins for the package to their corresponding electrode pads of the semiconductor chip CHP, the package's pins function as the pins of each semiconductor device.

In the type development, the semiconductor device 100 is provided by coupling the corresponding electrode pads of the semiconductor chip CHP to the pins 1 to 120 of the package for the semiconductor device 100. The semiconductor device 200 is provided by coupling the corresponding electrode pads of the semiconductor chip CHP to the pins 1 to 80 of the package for the semiconductor device 200. Likewise, the semiconductor device 300 is provided by coupling the corresponding electrode pads of the semiconductor chip CHP to the pins 1 to 64 of the package for the semiconductor device 300.

The semiconductor device 100 will first be described by way of example. By coupling the corresponding electrode pads of the semiconductor chip CHP to the pins 1 to 120 of the package for the semiconductor device 100, the pins 1 to 120 of the semiconductor device 100 function as a plurality of input/output ports, control terminals and power supply terminals. In FIG. 1, the pins 61 to 90 provided on the side of the upper side are assigned as ports P0 and P4 and function as ports. The pins 31 to 60 provided on the side of the right side are assigned as ports P1 and P5 and function as ports. The pins 91 to 120 provided on the side of the left side are also assigned as ports P3 and P7 and function as ports.

Further, in the same figure, the pins 1 to 13 and 18 to 30 provided on the side of the lower side are assigned as ports P2 and P6 and function as ports. The pin 17 provided on the side of the lower side is assigned as a rest input terminal C1 supplied with a reset signal and functions as a reset input terminal. The pin 16 is assigned as a clock input terminal C2 supplied with a clock signal and functions as a clock input terminal. The pins 15 and 14 are assigned as power supply terminals and function as power supply terminals. In this case, the pin 15 functions as a ground voltage terminal C3 supplied with a ground voltage, and the pin 14 functions as a power supply voltage terminal C4 supplied with a power supply voltage.

In the present embodiment 1, the ports P0 and P3 of the semiconductor device 100 are respectively ports where the input or output of 16 bits is taken temporally in parallel by one access. The ports P4, P5, and P7 are respectively ports where the input or output of 14 bits is taken temporally in parallel by one access. Further, the port P6 is a port where the input or output of 10 bits is taken temporally in parallel by one access.

At the upper side of the semiconductor device 100, the port P0 (first port) is comprised of two ports P0-1 (second port) and P0-2 (third port). The port P4 (fourth port) is arranged so as to be sandwiched between the port P0-1 and the port P0-2. That is, the function of the port P0-1 is assigned to the pins 83 to 90, and the function of the port P0-2 is assigned to the pins 61 to 68. The port P4 is assigned to the pins 69 to 82 sandwiched between the pins 68 and 83. Here, although the ports P0-1 and P0-2 are respectively ports where the input or output of 8 bits is performed, they are substantially simultaneously operated by one access and function as ports of 16 bits. In other words, the port P0 (first port) can be assumed to have been divided into the two ports P0-1 (second port) and P0-2 (third port).

Further, at the right side of the semiconductor device 100, the port P1 (first port) is comprised of two ports P1-1 (second port) and P1-2 (third port). The port P5 (fourth port) is arranged so as to be sandwiched between the port P1-1 and the port P1-2. That is, the function of the port P1-1 is assigned to the pins 53 to 60, and the function of the port P1-2 is assigned to the pins 31 to 38. The port P5 is assigned to the pins 39 to 52 sandwiched between the pins 38 and 53. Even here, though the ports P1-1 and P1-2 are respectively ports where the input or output of 8 bits is performed, they are substantially simultaneously operated by one access and function as ports of 16 bits.

Likewise, at the left side of the semiconductor device 100, the port P3 (first port) is comprised of two ports P3-1 (second port) and P3-2 (third port). The port P7 (fourth port) is arranged so as to be sandwiched between the port P3-1 and the port P3-2. That is, the function of the port P3-1 is assigned to the pins 113 to 120, the function of the port P3-2 is assigned to the pins 91 to 98, and the port P7 is assigned to the pins 99 to 112 sandwiched between the pins 98 and 113. Even here, though the ports P3-1 and P3-2 are respectively ports where the input or output of 8 bits is performed, they are substantially simultaneously operated by one access, and function as ports of 16 bits.

Moreover, at the lower side of the semiconductor device 100, the port P2 (first port) is comprised of two ports P2-1 (second port) and P2-2 (third port). The port P6 (fourth port), the reset input terminal C1, the clock input terminal C2, the ground voltage terminal C3, and the power supply voltage terminal C4 are arranged so as to be sandwiched between the ports P2-1 and P2-2. That is, the function of the port P2-1 is assigned to the pins 23 to 30, and the function of the port P2-2 is assigned to the pins 1 to 8. The port P6, the reset input terminal C1, the clock input terminal C2, the ground voltage terminal C3, and the power supply voltage terminal C4 are assigned to the pins 9 to 22 sandwiched between the pins 8 and 23.

The port P6 is also comprised of two ports P6-1 and P6-2. The port P6-1 is assigned to the pins 18 to 22, and the port P6-2 is assigned to the pins 9 to 13. The reset input terminal C1, the clock input terminal C2, the ground voltage terminal C3, and the power supply voltage terminal C4 are assigned to the pins 14 to 17 so as to be sandwiched between the ports P6-1 and P6-2. The port P6 is an input/output port where the input or output of 10 bits is taken temporally in parallel by one access. The ports P6-1 and P6-2 that configure the port P6 respectively serve as input/output ports of 5 bits.

The pins 1 to 120 of the semiconductor device 100 are coupled to their corresponding electrode pads arranged over the main surface of the semiconductor chip CHP. Upon the type development, the pins 1 to 80 (1 to 64) of the semiconductor device 200 (300) are coupled to their corresponding electrode pads arranged over the main surface of the semiconductor chip CHP.

A description will first be made about the case where the semiconductor device 200 having the 80 pins is provided by the type development. The electrode pads of the semiconductor chip CHP, which have been coupled to the pins of the semiconductor device 100, are changed so as to be coupled to the pins of the semiconductor device 200 as indicated by dashed lines 220 with arrows in FIG. 1.

That is, the electrode pads of the semiconductor chip CHP, which have been coupled to the pins 1 to 8, 14 to 17, and 23 to 30 of the semiconductor device 100, are coupled to the pins 1 to 8, 9 to 12, and 13 to 20 of the semiconductor device 200. The electrode pads of the semiconductor chip CHP, which have been coupled to the pins 31 to 39, 45 and 46, and 52 to 60 of the semiconductor device 100, are coupled to the pins 21 to 29, 30 and 31, and 32 to 40 of the semiconductor device 200. Likewise, the electrode pads of the semiconductor chip CHP, which have been coupled to the pins 61 to 69, 75 and 76, and 82 to 90 of the semiconductor device 100, are coupled to the pins 41 to 49, 50 and 51, and 52 to 60 of the semiconductor device 200. The electrode pads of the semiconductor chip CHP, which have been coupled to the pins 91 to 99, 105 and 106, and 112 to 120 of the semiconductor device 100, are coupled to the pins 61 to 69 and 70 and 71, and 72 to 80 of the semiconductor device 200.

Thus, the port P0-1 is assigned to the pins 53 to 60 of the semiconductor device 200. The port P0-2 is assigned to the pins 41 to 48 of the semiconductor device 200. The port P4 is assigned to the pins 49 to 52 of the semiconductor device 200. Similarly, the port P1-1 is assigned to the pins 33 to 40 of the semiconductor device 200. The port P1-2 is assigned to the pins 21 to 28 of the semiconductor device 200. The port P5 is assigned to the pins 29 to 32 of the semiconductor device 200. The port P3-1 is assigned to the pins 73 to 80 of the semiconductor device 200. The port P3-2 is assigned to the pins 61 to 68 of the semiconductor device 200. The port P7 is assigned to the pins 69 to 72 of the semiconductor device 200.

Further, the port P2-1 is assigned to the pins 13 to 20 of the semiconductor device 200. The port P2-2 is assigned to the pins 1 to 8 of the semiconductor device 200. The reset input terminal C1, the clock input terminal C2, the ground voltage terminal C3, and the power supply voltage terminal C4 are assigned to the pins 12 to 9 of the semiconductor device 200. In the 80-pin semiconductor device 200, the ports P6-1 and P6-2 are not assigned to the pins.

A description will next be made about the case where the semiconductor device 300 having the 64 pins is provided by the type development. The electrode pads of the semiconductor chip CHP, which have been coupled to the pins of the semiconductor device 200, are changed so as to be coupled to the pins of the semiconductor device 300 as indicated by broken lines 320 with arrows in FIG. 1. That is, the electrode pads of the semiconductor chip CHP, which have been coupled to the pins 1 to 6, 9 to 12, and 15 to 20 of the semiconductor device 200, are coupled to the pins 1 to 6, 7 to 10, and 11 to 16 of the semiconductor device 300. The electrode pads of the semiconductor chip CHP, which have been coupled to the pins 21 to 27, 30 and 31, and 34 to 40 of the semiconductor device 200, are coupled to the pins 17 to 23, 24 and 25, and 26 to 32 of the semiconductor device 300. Likewise, the electrode pads of the semiconductor chip CHP, which have been coupled to the pins 41 to 47, 50 and 51, and 54 to 60 of the semiconductor device 200, are coupled to the pins 33 to 39, 40 and 41, and 42 to 48 of the semiconductor device 300. The electrode pads of the semiconductor chip CHP, which have been coupled to the pins 61 to 67, 70 and 71, and 74 to 80 of the semiconductor device 200, are coupled to the pins 49 to 55, 56 and 57, and 58 to 64 of the semiconductor device 300.

Thus, the port P0-1 is assigned to the pins 42 to 48 of the semiconductor device 300. The port P0-2 is assigned to the pins 33 to 39 of the semiconductor device 300. The port P4 is assigned to the pins 40 and 41 of the semiconductor device 300. Similarly, the port P1-1 is assigned to the pins 26 to 32 of the semiconductor device 300. The port P1-2 is assigned to the pins 17 to 23 of the semiconductor device 300. The port P5 is assigned to the pins 24 and 25 of the semiconductor device 300. The port P3-1 is assigned to the pins 58 to 64 of the semiconductor device 300. The port P3-2 is assigned to the pins 49 to 55 of the semiconductor device 300. The port P7 is assigned to the pins 56 and 57 of the semiconductor device 300.

Further, the port P2-1 is assigned to the pins 11 to 16 of the semiconductor device 300. The port P2-2 is assigned to the pins 1 to 6 of the semiconductor device 300. The reset input terminal C1, the clock input terminal C2, the ground voltage terminal C3, and the power supply voltage terminal C4 are assigned to the pins 7 to 10 of the semiconductor device 300. Even in the 64-pin semiconductor device 300, the ports P6-1 and P6-2 are not assigned to the pins.

Thus, when providing the semiconductor devices 200 and 300 small in pin number, maintaining the number of bits of the port (first port) comprised of the two ports (second port and third port) is given priority, and the number of bits of the port (fourth port) disposed between the two ports is reduced.

Changes in the number of bits of the ports P0 to P7 where the type development is carried in the above-described manner are shown in FIG. 2. The ports P0 to P3 (first port) respectively comprised of the two ports (second port and third port) make it possible to prevent a substantial reduction in the number of bits even in the semiconductor devices small in pin number by avoiding the coupling of the pins configuring the port (fourth port) disposed between the ports to the electrode pads of the semiconductor chip upon the type development. That is, even when the 120-pin package is changed to the 80-pin package in the type development, the ports P0 to P3 are capable of continuously performing processing of 16 bits by one access. Further, even when changing to the 64-pin package, the ports P0, P1, and P3 are capable of processing of 14 bits by one access, and the port P2 is also capable of processing of 12 bits.

Thus, it is possible to provide in the type development, the semiconductor devices 100, 200, and 300 different from each other in pin number by using the semiconductor chip CHP having the same configuration. Further, when the semiconductor device 200 or 300 small in pin number is provided, the pins (pins 69 to 82) configuring the port (port P4) disposed between the plural ports (P0-1, P0-2) configuring one port (e.g., port P0), and the semiconductor chip CHP are configured so as not to be coupled to each other. Thus, it is possible to reduce a substantial decrease in the number of bits of the port (port P0) where the input/output is taken temporally in parallel by one access, and to reduce degradation of usability.

<Configuration of Semiconductor Chip>

Figure 3:
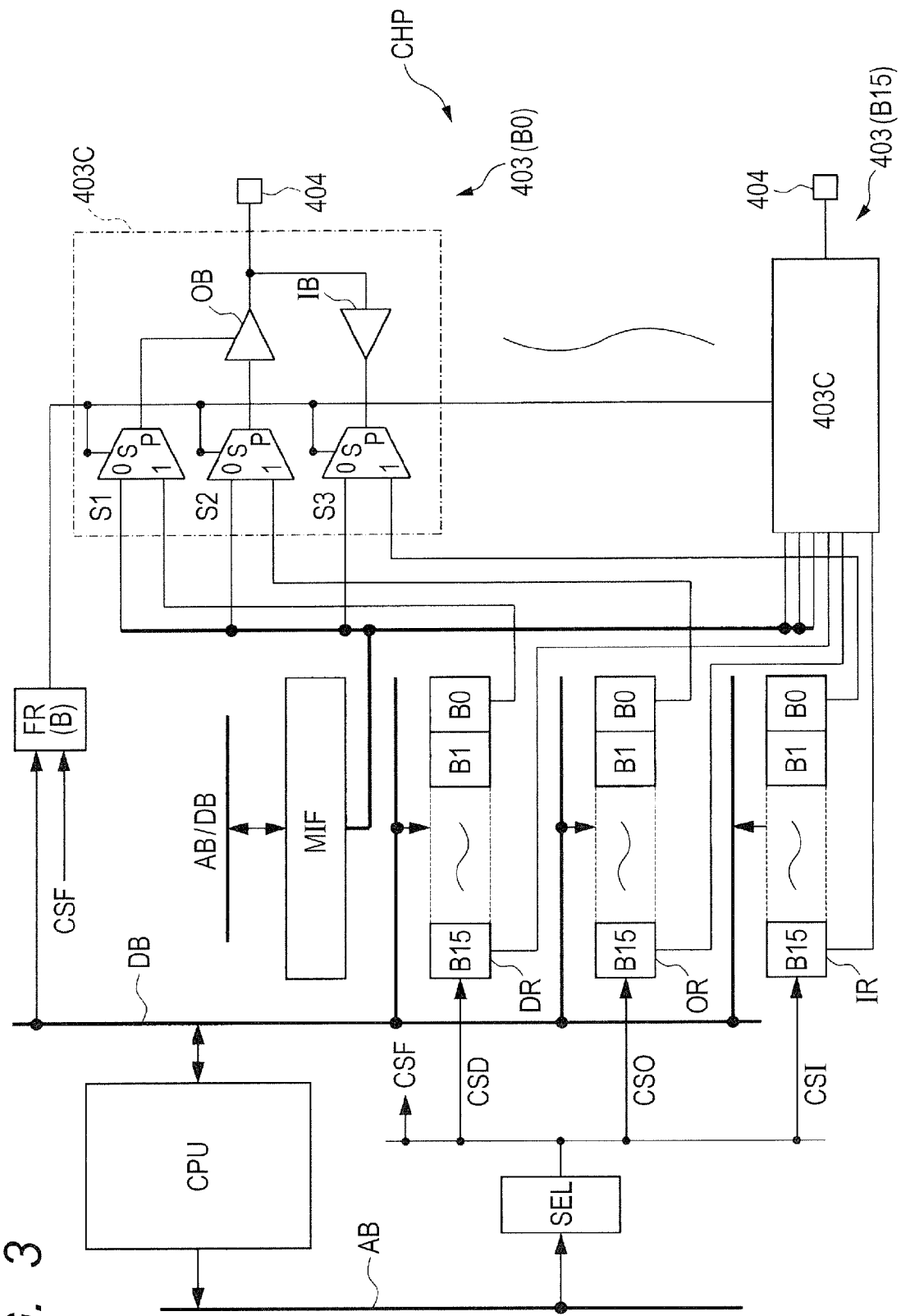
FIG. 3 is a block diagram showing the configuration of a principal part of a semiconductor chip according to the embodiment 1.

FIG. 3 is a block diagram showing the configuration of a principal part of the semiconductor chip CHP. The semiconductor chip CHP in the present embodiment is not limited in particular, but is equipped with a microcontroller, a memory interface circuit, a plurality of input/output circuit units configuring the ports P0 to P7 respectively, and a plurality of registers corresponding to the ports P0 to P7 respectively.

In the same drawing, CPU indicates the microcontroller (hereinafter also called "micon"). The microcontroller CPU is operated in accordance with a program stored in an unillustrated memory. The microcontroller CPU performs transmission/reception of data to and from the outside of the semiconductor device via the ports P0 to P7 when the microcontroller CPU is operated according to the program.

The input/output circuit units respectively configuring the ports P0 to P7, and the registers respectively corresponding to the P0 to P7 are not limited in particular, but have mutually the same configuration between the ports P0 and P7. Therefore, the input/output circuit unit configuring the port P0, and the registers corresponding to the port P0 are shown in FIG. 3. Input/output circuit units and a plurality of registers similar in configuration are provided even in the remaining ports P1 to P7. The port P0 shown in FIG. 3 will be described here by way of example, and the description of the remaining ports P1 to P7 will be omitted.

The port P0 performs the input or output of 16 bits (B0) to (B15) temporally in parallel through the input/output circuit unit. Therefore, the input/output circuit unit of the port P0 has 16 unit input/output circuit units 403 (B0) to 403 (B15). Here, the unit input/output circuit units 403 (B0) to 403 (B15) respectively correspond to the bits (B0) to (B15) of 16 bits inputted or outputted temporally in parallel through the port P0. Since the unit input/output circuit units are identical in configuration to each other, only the configuration of the unit input/output circuit unit 403 (B0) is shown in detail in FIG. 3. Incidentally, the unit input/output circuit unit may simply be referred to as an input/output circuit unit in the present specification.

The unit input/output circuit units 403 (B0) to 403 (B15) will be described using the unit input/output circuit unit 403 (B0) shown in FIG. 3. The unit input/output circuit units 403 (B0) is equipped with an electrode pad 404 and a unit input/output circuit 403C disposed in the main surface of the semiconductor chip CHP. The unit input/output circuit 403C has an output buffer OB, an input buffer IB, and selectors S1 to S3.

The output buffer OB has an input node, an output node, and a control node. The control node of the output buffer OB is supplied with an output signal from the selector S1 as a control signal. When the output signal from the selector S1 is a low level, the output buffer OB brings the output node into a high impedance state. On the other hand, when the output signal from the selector S1 is a high level, the output buffer OB outputs an output signal having a voltage according to the voltage supplied to the input node from the output node and supplies the same to its corresponding electrode pad 404.

The input buffer IB is equipped with an input node and an output node. The input signal supplied to the corresponding electrode pad 404 is supplied to the input node. The input buffer IB forms an output signal having a voltage according to the voltage of the input signal supplied to the input node and supplies the same from the output node to the selector S3.

Each of the selectors S1 to S3 has a selection node S, a common node P, and terminals 0 and 1. Each of the selectors S1 to S3 couples the common node P to the terminal 0 or 1 in accordance with the voltage (logical value) of a control signal supplied to the selection node S. In this case, when the voltage (logical value) of the control signal supplied to the selection node S is a low level (logical value 0), each of the selectors S1 to S3 couples the terminal 0 to the common node P. On the other hand, when the voltage (logical value) of the control signal is a high level (logical value 1), each of the selectors S1 to S3 couples the common node P to the terminal 1.

As registers corresponding to the port P0, a direction register DR to designate direction data of the port P0, an input register IR, and an output register OR are provided in the semiconductor chip CHP. Since the input or output of 16 bits is taken temporally in parallel through the port P0, each of the direction register DR, the input register IR, and the output register OR is a 16-bit register.

Although not limited in particular, the port P0 is used in common as an input/output port and a port for the memory interface circuit MIF. Whether to use the port P0 as the input/output port or the port for the memory interface circuit MIF is determined by a function register FR. The function register FR is a register having a plurality of bits. Each of the ports P1 to P7 is also used in common as an input/output port and another functional port. Whether to use the ports P0 to P7 as the input/output ports or other functional ports is determined by the values set to the bits of the function register FR. That is, the function register FR serves as a register common to the ports P0 to P7. The bit (B) of the function register FR is a bit for determining whether to use the port P0 as the input/output port or the port for the memory interface circuit MIF.

The direction register DR, the input register IR, the output register OR, and the function register FR are respectively assigned addresses. That is, when the microcontroller CPU outputs the addresses assigned to the registers to an address bus AB, a selection circuit SEL identifies the addresses on the address bus AB, determines whether they correspond to the addresses assigned to the registers respectively, and thereby generates selection signals CSD, CSI, CSO, and CSF. For example, when the microcontroller CPU outputs the address assigned to the function register FR to the address bus AB, the selection circuit SEL turns the selection signal CSF into a high level. Consequently, the function register FR is selected so that data outputted from the microcontroller CPU to a data bus DB is written into the function register FR.

When the logical value 0 is written into the bit (B) of the function register FR from the microcontroller CPU, the control signal of the low level (logical value 0) is supplied from the bit (B) of the function register FR to the selection nodes S of the selectors S1 to S3. On the other hand, when the logical value 1 is written into the bit (B) of the function register FR, the control signal of the high level (logical value 1) is supplied from the bit (B) of the function register FR to the selection nodes S of the selectors S1 to S3.

A bit (B0) of the direction register DR is coupled to the terminal 1 of the selector S1. A bit (B0) of the output register OR is coupled to the terminal 1 of the selector S2. A bit (B0) of the input register IR is coupled to the terminal 1 of the selector S3. Further, the memory interface circuit MIF is coupled to the terminals 0 of the selectors S1 to S3.

The input/output circuit unit 403 (B0) corresponds to the bit (B0) within the 16 bits inputted or outputted temporally in parallel through the port P0. Therefore, the bits (B0) of the direction register DR, the output register OR, and the input register IR are coupled to the terminals 1 of the selectors S1 to S3 included in the input/output circuit unit 403 (B0). The bits of the direction register DR, the output register OR, and the input register IR coupled to the terminals 1 of the selectors S1 to S3 in the input/output circuit units 403 (B0) to 403 (B15) change according to their corresponding bits (B0) to (B15). For example, the bits (B15) of the direction register DR, the output register OR, and the input register IR are coupled to the terminals 1 of the selectors S1 to S3 included in the input/output circuit unit 403 (B15) corresponding to the bit (B15).

When the microcontroller CPU outputs the address assigned to the function register FR to the address bus AB to select the function register FR and writes the logical value 0 into the bit (B) of the function register FR, the selector S1 supplies a signal from the memory interface circuit MIF to the control node of the output buffer OB as a control signal. Further, the selector S2 supplies the signal from the memory interface circuit MIF to the input node of the output buffer OB, and the selector S3 supplies an output signal of the input buffer IB to the memory interface circuit MIF. Although not limited in particular, the memory interface circuit MIF is coupled to the address bus AB and the data bus DB and performs the transmission/reception of the control signal on the memory interface.

For example, when a high-level control signal is supplied from the memory interface circuit MIF to the control node of the output buffer OB through the selector S1, the output from the memory interface circuit MIF is supplied to the input node of the output buffer OB through the selector S2. Then, the output from the memory interface circuit MIF is transferred to the electrode pad 404 and thereby outputted from the port P0. On the other hand, when a low-level control signal is supplied from the memory interface circuit MIF to the control node of the output buffer OB through the selector S1, the output node of the output buffer OB is brought into a high impedance state. At this time, the input signal supplied to the electrode pad 404 is supplied to the memory interface circuit MIF through the input buffer IB and the selector S3.

A description will next be made about the case where the port P0 is used as an input/output port. The microcontroller CPU outputs the address assigned to the function register FR to the address bus AB. Consequently, the function register FR is selected, and the logical value 1 is written into the bit (B) of the function register FR from the microcontroller CPU through the data bus DB. Then, the logical value 1 is supplied from the bit (B) of the function register FR to the selection nodes S of the selectors S1 to S3. Thus, each of the selectors S1 to S3 couples the terminal 1 and the common node P.

The selector S1 supplies the level of the bit (B0) of the direction register DR, which has been supplied to the terminal 1, to the control node of the output buffer OB as a control signal. The microcontroller CPU determines in advance whether the bit (B0) of the port P0 is used as either the input port or the output port. That is, the microcontroller CPU outputs the address assigned to the direction register DR to the address bus AB. When the selection circuit SEL determines that the address at the address bus AB corresponds to the address assigned to the direction register DR, the selection circuit SEL turns the selection signal CSD into a high level. With the turning of the selection signal CSD into the high level, the direction register DR is selected, and the data supplied from the microcontroller CPU to the data bus DB is written into each of the bits (B0) to (B15) of the selected direction register DR as data indicative of the direction.

For example, when the logical value 1 is written into the bits (B0) to (B15) of the direction register DR, a high level corresponding to the logical value 1 is supplied to the control nodes of the output buffers OB in the input/output circuit units 403 (B0) to 403 (B15) as a control signal. Thus, the output buffers OB in the input/output circuit units 403 (B0) to 403 (B15) are capable of forming output signals each having a voltage corresponding to a voltage according to the logical value at each of the bits of the output register OR, which is supplied to the input node and supplying the same to their corresponding electrode pads 404.

The microcontroller CPU outputs the address assigned to the output register OR to the address bus AB. At this time, the microcontroller CPU outputs data to be outputted to the data bus DB. When the selection circuit SEL determines the address at the address bus AB to be the address assigned to the output register OR, the selection circuit SEL turns the selection signal CSO into a high level. Thus, the output register OR is selected, which in turn writes data at the data bus DB into the bits (B0) to (B15). The data written into the output register OR is supplied to the output buffer OB through the selector S2 in each of the input/output circuit units 403 (B0) to 403 (B15). The output buffer OB forms an output signal corresponding to the data written into the output register OR and supplies the same to the corresponding electrode pad 404. That is, each bit of the output register OR is coupled to the corresponding electrode pad 404.

Thus, the data of 16 bits are supplied to the electrode pads 404 corresponding to the port P0 temporally in parallel by one access to the output register OR.

Further, when the logical value 0 is written into the bits (B0) to (B15) of the direction register DR where the direction register DR is selected, a low-level control signal is supplied to the control nods of the output buffers OB in the input/output circuit units 403 (B0) to 403 (B15). In this case, the output nodes of the output buffers OB are respectively brought into a high-impedance state. At this time, the signal at each electrode pad 404 is supplied to the corresponding bit in the input register IR through the input buffer IB and the selector S3 and stored thereat. That is, each bit in the input register IR is coupled to the corresponding electrode pad 404.

The microcontroller CPU outputs the address assigned to the input register IR to the address bus AB to thereby select the input register IR. The input register IR supplies the stored data to the data bus DB. At this time, the microcontroller CPU reads the data at the data bus DB. Thus, the microcontroller CPU is capable of reading the data of 16 bits supplied to the electrode pads 404 configuring the port P0 temporally in parallel by one access to the input register IR.

Although there has been described the example of writing the logical value 1 or 0 into the bits (B0) to (B15) of the direction register DR, it is needless to say that the logical value 1 and the logical value 0 may be written into the direction register DR while mixing the logical value 1 and the logical value 0. By doing this, the input and output can be set for every bit of the port P0.

<Structure of Semiconductor Chip>

Figure 4:
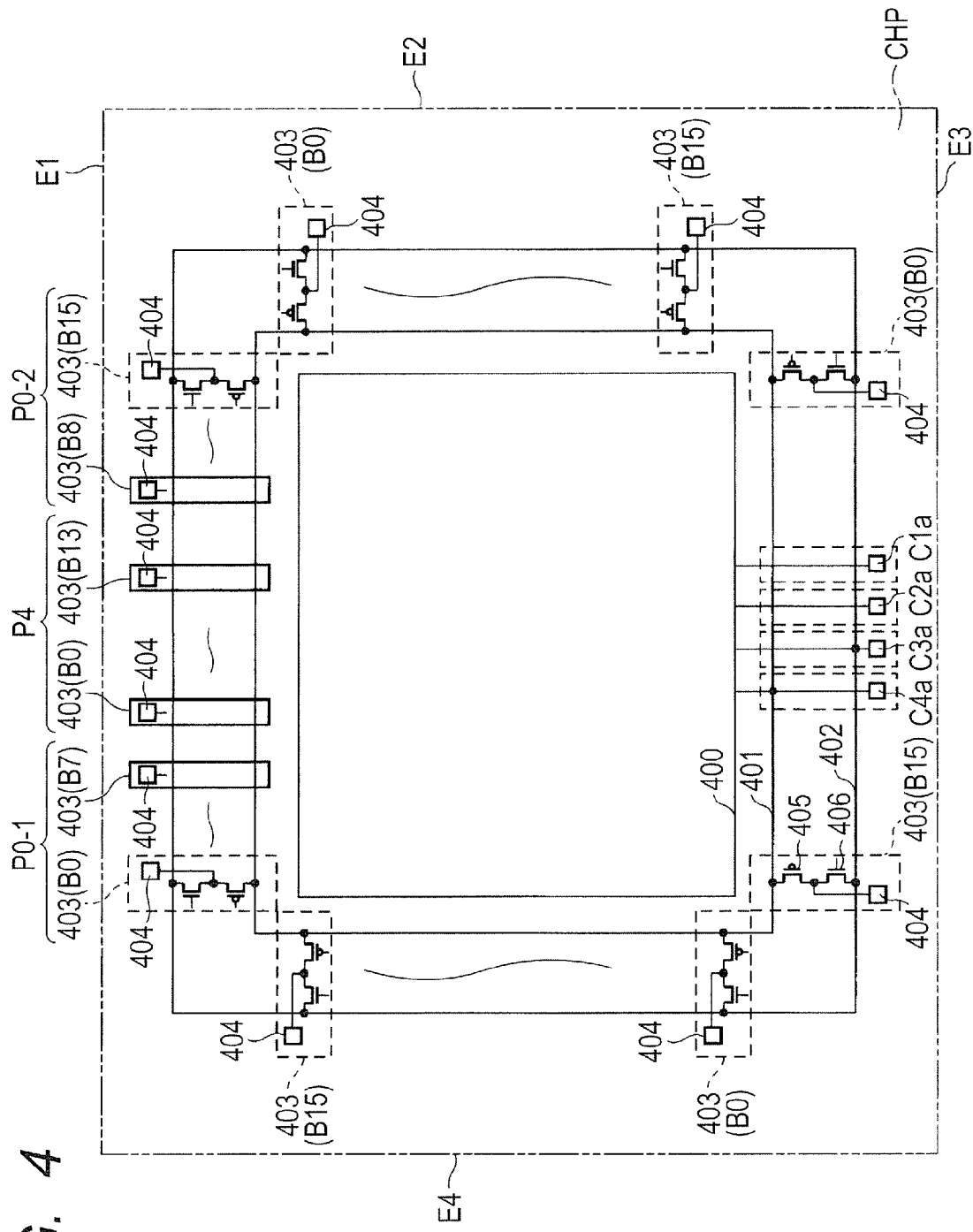
FIG. 4 is a plan diagram typically showing the structure of the semiconductor chip according to the embodiment 1.

FIG. 4 is a plan diagram typically showing the structure of the semiconductor chip CHP according to the embodiment 1. Although typically shown, the arrangement of FIG. 4 is drawn in accordance with an actual arrangement.

The semiconductor chip CHP has four sides E1 to E4 and a main surface surrounded by the four sides E1 to E4 in plan view. Here, the side E3 is opposite to the side E1, the side E2 is opposite to the side E4, and the sides E2 and E4 respectively cross the sides E1 and E3. In the same figure, reference numeral 400 indicates an internal circuit. The internal circuit 400 includes, for example, the microcontroller CPU, the registers FR, OR, DR, and IR, the selection circuit SEL, the memory interface circuit MIF, the address bus AB, and the data bus DB, etc. Further, in the same figure, reference numeral 401 indicates a power supply wiring which supplies a power supply voltage, and reference numeral 402 indicates a power supply wiring which supplies a ground voltage. The power supply wirings 401 and 402 are arranged at the peripheral edge portions of the semiconductor chip CHP along the sides E1 to E4. In FIG. 4, plural reference numerals 403 indicate the input/output circuit units described in FIG. 3. The input/output circuit units 403 are arranged at the peripheral edge portions of the semiconductor chip CHP along the sides E1 to E4. Each of the input/output circuit units 403 has the input/output circuit 403C and the electrode pad 404 as described in FIG. 3. Since the input/output circuit units 403 are arranged at the peripheral edge portions of the semiconductor chip CHP along the sides E1 to E4, the electrode pads 404 are also arranged at the peripheral edge portions of the semiconductor chip CHP along the sides E1 to E4.

In the present embodiment 1, the input/output circuit units 403 which configure the ports P0 and P4 are arranged along the side E1 of the semiconductor chip CHP. Further, the input/output circuit units 403 which configure the ports P1 and P5, are arranged along the side E2 of the semiconductor chip CHP. The input/output circuit units 403 which configure the ports P2 and P6, are arranged along the side E3 of the semiconductor chip CHP. The input/output circuit units 403 which configure the ports P3 and P7, are arranged along the side E4 of the semiconductor chip CHP.

Each of the ports P0 to P3, and P6 is comprised of the two ports as shown in FIG. 1. In matching with this, the input/output circuit units 403 which respectively configure the ports P0 to P3, and P6, are also comprised of two sets of groups. The port P0 (first port) will be described by way of example. The input/output circuit units of the first group which configures the port P0 (first port) are comprised of the input/output circuit units of the second group corresponding to the port P0-1 (second port) and the input/output circuit units of the third group corresponding to the port P0-2 (third port). Since the ports P0-1 and P0-2 are respectively 8 bits, the input/output circuit units of the second group and the input/output circuit units of the third group are respectively comprised of eight input/output circuit units in matching with it.

In FIG. 4, the eight input/output circuit units which configure the input/output circuit units of the second group, are drawn as the input/output circuit units 403 (B0) to 403 (B7). The eight input/output circuit units which configure the input/output circuit units of the third group, are drawn as the input/output circuit units 403 (B8) to 403 (B15). The input/output circuit units 403 (B0) to 403 (B7) of the second group and the input/output circuit units 403 (B8) to 403 (B15) of the third group are respectively arranged along the side E1 of the semiconductor chip CHP in such a manner that the rows of the input/output circuit units 403 (B0) to 403

(B7) and the input/output circuit units 403 (B8) to 403 (B15) become parallel with the side E1. Further, the input/output circuit units 403 (B0) to 403 (B7) of the second group are arranged on one side of the side E1, and the input/output circuit units 403 (B8) to 403 (B15) of the third group are arranged on the other end side of the side E1. The input/output circuit units 403 (B0) to 403 (B13) of the fourth group which configures the port P4 (fourth port), are also respectively arranged along the side E1 of the semiconductor chip CHP in such a manner that the row of the input/output circuit units 403 (B0) to 403 (B13) of the fourth group becomes parallel with the side E1. In this embodiment 1, the input/output circuit units 403 (B0) to 403 (B13) of the fourth group which configures the port P4 (fourth port), are arranged so as to be sandwiched between the input/output circuit units 403 (B0) to 403 (B7) of the second group and the input/output circuit units 403 (B8) to 403 (B15) of the third group. That is, the input/output circuit units 403 (B0) to 403 (B13) of the fourth group are arranged near the center of the side E1.

The input/output circuit units 403 which configure the ports P0 and P4, respectively have the electrode pads 404 as described in FIG. 3. The electrode pads 404 of the input/output circuit units 403 (B0) to 403 (B15) which configure the port P0 (first port), are also arranged along the side E1 of the semiconductor chip CHP in such a manner that the row of these electrode pads 404 becomes parallel with the side E1. Further, the electrode pads 404 of the input/output circuit units 403 (B0) to 403 (B13) which configure the port P4 (fourth port), are also arranged along the side E1 of the semiconductor chip CHP in such a manner that the row of these electrode pads 404 becomes parallel with the side E1. In this embodiment 1, the input/output circuit units 403 (B0) to 403 (B13) which configure the port P4 (fourth port), are arranged between the input/output circuit units 403 (B0) to 403 (B7) of the second group corresponding to the port P0-1 and the input/output circuit units 403 (B8) to 403 (B15) of the third group configuring the port P0-2. Therefore, the electrode pads 404 of the input/output circuit units 403 (B0) to 403 (B13) of the fourth group configuring the port P4 (fourth port), are also arranged between the electrode pads 404 of the input/output circuit units 403 (B0) to 403 (B7) of the second group and the electrode pads 404 of the input/output circuit units 403 (B8) to 403 (B15) of the third group configuring the port P0-2.

The electrode pads 404 of the input/output circuit units 403 (B0) to 403 (B15) of the first group configuring the port P0 (first port), the electrode pads 404 of the input/output circuit units 403 (B0) to 403 (B7) of the second group configuring the port P0-1 (second port), and the electrode pads 404 of the input/output circuit units 403 (B8) to 403 (B15) of the third group configuring the port P0-2 (third port) can respectively be assumed to be first electrode pads, second electrode pads, and third electrode pads. In this case, the electrode pads 404 of the input/output circuit units 403 (B0) to 403 (B13) of the fourth group configuring the port P4 (fourth port) can be assumed to be fourth electrode pads. When they are assumed in this way, the first electrode pads are plural and include the second and third electrode pads arranged along the side E1 of the semiconductor chip CHP. The fourth electrode pads arranged along the side E1 are arranged between the second and third electrode pads.

While the input/output circuit units 403 which configure the ports P0 and P4 arranged along the side E1 of the semiconductor chip CHP, have been described, the ports P1 to P3 and P5 to P7 arranged along other sides E2 to E4 are also similar.

That is, the input/output circuit units 403 of the second and third groups which configure the ports P1-1 and P1-2, and the input/output circuit units 403 of the fourth group which configures the port P5, are arranged along the side E2 of the semiconductor chip CHP. The input/output circuit units 403 of the fourth group which configures the port P5, are arranged between the input/output circuit units 403 which configure the port P1-1, and the input/output circuit units 403 of the third group which configures the port P1-2. In matching with this, the electrode pads 404 in the input/output circuit units 403 of the port P5 are arranged between the electrode pads 404 in the input/output circuit units 403 of the port P1-1 and the electrode pads 404 of the input/output circuit units 403 of the port P1-2. Of course, these electrode pads 404 are arranged along the side E2 of the semiconductor chip CHP.

Further, the input/output circuit units 403 of the second and third groups which configure the ports P3-1 and P3-2, and the input/output circuit units 403 of the fourth group which configures the port P7, are arranged along the side E4 of the semiconductor chip CHP. The input/output circuit units 403 of the fourth group which configures the port P7, are arranged between the input/output circuit units 403 of the second group which configures the port P3-1, and the input/output circuit units 403 of the third group which configures the port P3-2. In matching with this, the electrode pads 404 in the input/output circuit units 403 of the port P7 are arranged between the electrode pads 404 in the input/output circuit units 403 of the port P3-1 and the electrode pads 404 in the input/output circuit units 403 of the port P3-2. Of course, these electrode pads 404 are arranged along the side E4 of the semiconductor chip CHP.

At the side E3 of the semiconductor chip CHP, the input/output circuit units 403 which configure the ports P2-1, P2-2, P6-1, and P6-2, are arranged along the side E3. Further, at the side E3, electrode pads C1a, C2a, C3a, and C4a are arranged along the side E3. The electrode pads C1a, C2a, C3a, and C4a are arranged between the input/output circuit units 403 which configure the port P6-1, and the input/output circuit units 403 which configure the port P6-2. Further, the electrode pads C1a, C2a, C3a, and C4a, the input/output circuit units 403 which configure the port P6-1, and the input/output circuit units 403 which configure the port P6-2, are arranged between the input/output circuit units 403 of the second group which configures the port P2-1, and the input/output circuit units 403 of the third group which configures the port P2-2.

When viewing the electrode pads 404 in the input/output circuit units 403 which configure the ports P2-1, P2-2, P6-1, and P6-2, and the electrode pads C1a, C2a, C3a, and C4a, the electrode pads 404 in the input/output circuit units 403 for these pads, and the electrode pads C1a, C2a, C3a, and C4a are also arranged along the side E3 of the semiconductor chip CHP. Also, the electrode pads C1a, C2a, C3a, and C4a are arranged between the electrode pads 404 in the input/output circuit units 403 of the port P6-1 and the electrode pads 404 in the input/output circuit units 403 of the port P6-2. Further, the electrode pads C1a, C2a, C3a, and C4a and the electrode pads 404 in the input/output circuit units 403 of the ports P6-1 and P6-2 are arranged between the electrode pads 404 in the input/output circuit units 403 of the port P2-1 and the electrode pads 404 in the input/output circuit units 403 of the port P2-2.

The electrode pad C1a arranged along the side E3 is coupled to the reset input terminal C1, the electrode pad C2a is coupled to the cock input terminal C2, the electrode pad C3a is coupled to the ground voltage terminal C3, and the electrode pad C4a is coupled to the power supply voltage terminal C4 whey they are packaged in the package. The electrode pad C3a is coupled to the power supply wiring 402, and the electrode pad C4a is coupled to the power supply wiring 401. Further, the electrode pads C3a and C4a are coupled even to the internal circuit 400. The ground voltage terminal C3 is supplied with the ground voltage, and the power supply voltage terminal C4 is supplied with the power supply voltage. Thus, an operating power supply voltage is supplied to each of the internal circuit 400 and the power supply wirings 401 and 402.

The electrode pad C1a arranged along the side E3 is coupled to the reset input terminal C1, and the electrode pad C2a is coupled to the clock input terminal C2 when they are packaged in the package. The electrode pads C1a and C2a are coupled to the internal circuit 400. Although not limited in particular, the electrode pads C1a and C2a are coupled to the microcontroller CPU shown in FIG. 3. Thus, the microcontroller CPU is operated in accordance with the clock signal supplied to the clock input terminal C2. Further, the microcontroller CPU can be reset by the reset signal supplied to the resent input terminal C1.

These electrode pads C1a, C2a, C3a, and C4a are arranged between the electrode pads 404 in the input/output circuit units 403 of the ports P2-1 and P6-1, and the electrode pads 404 in the input/output circuit units 403 of the ports P2-2 and P6-2. Therefore, these electrode pads C1a, C2a, C3a, and C4a are arranged substantially in the center of the side E3 of the semiconductor chip CHP. Further, when the semiconductor device small in pin number is provided, the electrode pads 404 in the respective input/output circuit units 403 which configure the ports P6-1 and P6-2, are not coupled to the pins of the semiconductor device. Therefore, the ports P6-1 and P6-2 can be regarded as the fourth port, and the input/output circuit units 403 which configure the ports P6-1 and P6-2, can be regarded as the input/output circuit units of the fourth group.

Incidentally, the electrode pads 404, C1a, C2a, C3a, and C4a are formed over the main surface of the semiconductor chip CHP so as to be capable of being electrically coupled to the pins of the semiconductor device.

Since the input/output circuit units 403 are described in FIG. 3, they are drawn in FIG. 4 in a simplified form. Further, in order to avoid making FIG. 4 complicated, the relationship between the ports P0-1, P0-2 and P4 is shown only with respect to the input/output circuit units 403 arranged along the side E1. Regarding the input/output circuit units arranged along the side E2, only the input/output circuit unit 403 (B0) which configures the port P1-1, and the input/output circuit unit 403 (B15) which configures the port P1-2, are shown and other input/output circuit units are omitted. Likewise, in regard to the input/output circuit units arranged along the side E3, only the input/output circuit unit 403 (B0) which configures the port P2-1, and the input/output circuit unit 403 (B15) which configures the port P2-2 are shown, and other input/output circuit units are omitted. Further, even with respect to the input/output circuit units arranged along the side E4, only the input/output circuit unit 403 (B0) which configures the port P3-1, and the input/output circuit unit 403 (B15) which configures the port P3-2, are shown, and other input/output circuit units are omitted.

Even in regard to the input/output circuit 403C which configures each input/output circuit unit 403, only the configuration of part of the output buffer OB (FIG. 3) is shown in FIG. 4 to avoid making the drawing complicated. The input buffer IB and the selectors S1 to S3 are omitted. In the present embodiment, the output buffer OB is provided with a P channel type field effect transistor 405 coupled between the electrode pad 404 and the power supply wiring 401, and an N channel type field effect transistor 406 coupled between the electrode pad 404 and the power supply wiring 402. When the control signal from the selector S1 is a low level, the transistors 405 and 406 are both brought into an off state so that the electrode pad 404 is brought into a high impedance state. On the other hand, when the control signal from the selector S1 is a high level, the transistor 405 or 406 is brought into an on state according to the signal from the selector S2 to supply the voltage according to the signal from the selector S2 to the electrode pad 404.

<<Structure of Semiconductor Device>>

The electrodes pads 404, C1a, C2a, C3a, and C4a arranged over the main surface of the semiconductor chip CHP are electrically coupled to the pins of the semiconductor device.

<<120-Pin Semiconductor Device>>

First, when the 120-pin semiconductor device 100 is provided, all of the electrode pads 404 of the input/output circuit units 403 which configure the ports P0-1, P0-2, P1-1, P1-2, P2-1, P2-2, P3-1, P3-2, P4, P5, P6-1, P6-2, and P7 arranged over the main surface of the semiconductor chip CHP, and all pins of the semiconductor device 100 excluding the pins 14 to 17 are electrically coupled. Further, the electrode pads C4a, C3a, C2a, and C1a arranged over the main surface of the semiconductor chip CHP are electrically coupled to the pins 14 to 17 of the semiconductor device 100. At this time, the electrode pads 404 of the input/output circuit units 403 are coupled to their corresponding pins.

That is, the pads 404 in the input/output circuit units 403 which configure the port P0-1, are coupled to the pins of the semiconductor device 100 to which the port P0-1 is assigned. The pads 404 in the input/output circuit units 403 which configure the port P0-2, are coupled to the pins of the semiconductor device 100 to which the port P0-2 is assigned. The pads 404 in the input/output circuit units 403 which configure the port P4, are coupled to the pins of the semiconductor device 100 to which the port P4 is assigned. Likewise, the pads 404 in the input/output circuit units 403 which configure the port P1-1, are coupled to the pins of the semiconductor device 100 to which the port P1-1 is assigned. The pads 404 in the input/output circuit units 403 which configure the port P1-2, are coupled to the pins of the semiconductor device 100 to which the port P1-2 is assigned. The pads 404 in the input/output circuit units 403 which configure the port P5, are coupled to the pins of the semiconductor device 100 to which the port P5 is assigned.

Further, the pads 404 in the input/output circuit units 403 which configure the port 2-1, are coupled to the pins of the semiconductor device 100 to which the port P2-1 is assigned. The pads 404 in the input/output circuit units 403 which configure the port P2-2, are coupled to the pins of the semiconductor device 100 to which the port P2-2 is assigned. The pads 404 in the input/output circuit units 403 which configure the port P6-1, are coupled to the pins of the semiconductor device 100 to which the port P6-1 is assigned. The pads 404 in the input/output circuit units 403 which configure the port P6-2, are coupled to the pins of the semiconductor device 100 to which the port P6-2 is assigned.

Likewise, the pads 404 in the input/output circuit units 403 which configure the port P3-1, are coupled to the pins of the semiconductor device 100 to which the port P3-1 is assigned. The pads 404 in the input/output circuit units 403 which configure the port P3-2, are coupled to the pins of the semiconductor device 100 to which the port P3-2 is assigned. The pads 404 in the input/output circuit units 403 which configure the port P7, are coupled to the pins of the semiconductor device 100 to which the port P7 is assigned.

As shown in FIG. 1, at the side of the semiconductor device 100, which is opposite to the side E1 of the semiconductor chip CHP, the port P0-1 is assigned to the pins provided on one end side of the side, and the port P0-2 is assigned to the pins provided on the other end side of the side. Further, the port P4 is assigned to the pins arranged in the central portion of the side of the semiconductor device 100, which is opposite to the side E1. Therefore, at the respective ports P0-1, P0-2, and P4, the electrode pads 404 arranged in the semiconductor chip CHP and the pins of the semiconductor device 100 are made opposite to each other. Hence, the electrode pads 404 and the pins of the semiconductor device 100 can easily be coupled to each other by way of wires.

Although the ports P0-1, P0-2, and P4 have been described by way of example, other ports and terminals C1, C2, C3, and C4 are also similar to the above. That is, at the side E2, the electrode pads 404 arranged in the semiconductor chip CHP and the pins of the semiconductor device 100 are provided opposed to each other at the ports P1-1, P1-2, and P5. Also, at the side E4, the electrode pads 404 arranged in the semiconductor chip CHP and the pins of the semiconductor device 100 are provided opposed to each other at the ports P3-1, P3-2, and P7. Further, at the side E3, the electrode pads 404 and the electrode pads C1a, C2a, C3a, and C4a arranged in the semiconductor chip CHP, and the pins of the semiconductor device 100 are provided opposed to each other at the ports P2-1, P2-2, P6-1, P6-2, and the terminals C1, C2, C3, and C4.

<<80-Pin Semiconductor Device>>

When the 80-pin semiconductor device 200 is provided, the electrode pads 404 of the input/output circuit units 403 which configure the ports P0-1, P0-2, P1-1, P1-2, P2-1, P2-2, P3-1, and P3-2, which have been arranged over the main surface of the semiconductor chip CHP, are electrically coupled to the pins of the semiconductor device 200. On the other hand, at the ports P4, P5, and P7, the electrode pads 404 in part of the input/output circuit units 403 configuring these ports, which have been arranged over the main surface of the semiconductor chip CHP, are electrically coupled to the pins of the semiconductor device 200. The electrode pads 404 in the remaining input/output circuit units 403 are not coupled to the pins of the semiconductor device 200. Further, the electrode pads 404 of the input/output circuit units 403 which configure the ports P6-1 and P6-2, are not electrically coupled to the pins of the semiconductor device 200.

That is, the electrode pads 404 in the input/output circuit units 403 which configure the port P0-1, are coupled to the pins 53 to 60 of the semiconductor device 200. The electrode pads 404 in the input/output circuit units 403 which configure the port P0-2, are coupled to the pins 41 to 48 of the semiconductor device 200. Further, the electrode pads 404 in the input/output circuit units 403 which configure the port P1-1, are coupled to the pins 33 to 40 of the semiconductor device 200. The electrode pads 404 in the input/output circuit units 403 which configure the port P1-2, are coupled to the pins 21 to 28 of the semiconductor device 200.

Further, the electrode pads 404 in the input/output circuit units 403 which configure the port P2-1, are coupled to the pins 13 to 20 of the semiconductor device 200. The electrode pads 404 in the input/output circuit units 403 which configure the port P2-2, are coupled to the pins 1 to 8 of the semiconductor device 200. Further, the electrode pads 404 in the input/output circuit units 403 which configure the port P3-1, are coupled to the pins 73 to 80 of the semiconductor device 200, and the electrode pads 404 in the input/output circuit units 403 which configure the port P3-2, are coupled to the pins 61 to 68 of the semiconductor device 200.

On the other hand, in regard to the port P4, the electrode pads 404 in the four input/output circuit units 403 of the input/output circuit units 403 which configure the port P4, are coupled to their corresponding pins of the semiconductor device 200, and the electrode pads 404 in the remaining ten input/output circuit units 403 are not coupled to the pins of the semiconductor device 200. While the port P4 corresponds to the 14 bits (B0) to (B13), the electrode pads 404 of the four input/output circuit units 403 (B0), 403 (B6), 403 (B7), and 403 (B13) corresponding to the bits (B0), (B6), (B7), and (B13) of the 14 bits are coupled to the pins 49 to 52 of the semiconductor device 200. The electrode pads 404 of the ten four input/output circuit units 403 (B1) to 403 (B5) and 403 (B8) to 403 (B12) corresponding to the remaining ten bits (B1) to (B5) and (B8) to (B12) are not coupled to the pins of the semiconductor device 200.

Likewise, even with respect to the 14-bit port P5, the electrode pads 404 of the four input/output circuit units 403 (B0), 403 (B6), 403 (B7), and 403 (B13) corresponding to the bits (B0), (B6), (B7), and (B13) being the four bits of the fourteen bits are coupled to the pins 29 to 32 of the semiconductor device 200. The electrode pads 404 of the ten input/output circuit units 403 (B1) to 403 (B5) and 403 (B8) to 403 (B12) corresponding to the remaining ten bits (B1) to (B5) and (B8) to (B12) are not coupled to the pins of the semiconductor device 200. Further, even with respect to the 14-bit port P7, the electrode pads 404 of the fourth input/output circuit units 403 (B0), 404 (B6), 403 (B7), and 403 (B13) corresponding to the bits (B0), (B6), (B7), and (B13) corresponding to the four bits of the fourteen bits are coupled to the pins 69 to 72 of the semiconductor device 200. The electrode pads 404 of the ten input/output circuit units 403 (B1) to 403 (B5) and 403 (B8) to 403 (B12) corresponding to the remaining ten bits (B1) to (B5) and (B8) to (B12) are not coupled to the pins of the semiconductor device 200.

Even in the 80-pin semiconductor device 200, as shown in FIG. 1, at the side of the semiconductor device 100 opposite to the side E1 of the semiconductor chip CHP, the port P0-1 is assigned to the pins provided on one end side of the side thereof, and the port P0-2 is assigned to the pins provided on the other end side of the side thereof. Further, the port P4 is assigned to the pins arranged in the central portion of the side of the semiconductor device 100, which is opposite to the side E1. Therefore, at the respective ports P0-1, P0-2, and P4, the electrode pads 404 arranged in the semiconductor chip CHP and the pins of the semiconductor device 200 are made opposite to each other. Hence, the electrode pads 404 and the pins of the semiconductor device 100 can easily be coupled to each other by way of wires.

Although the ports P0-1, P0-2, and P4 have been described by way of example, other ports and terminals C1, C2, C3, and C4 are also similar to the above.

<<64-Pin Semiconductor Device>>

When the 64-pin semiconductor device 300 is provided, the electrode pads 404 in part of the input/output circuit units 403 configuring the ports P0-1, P0-2, P1-1, P1-2, P2-1, P2-2, P3-1, P3-2, P4, P5, and P7, which have been arranged overt the main surface of the semiconductor chip CHP, are electrically coupled to the pins of the semiconductor device 300. The electrode pads 404 in the remaining input/output circuit units 403 are not coupled to the pins of the semiconductor device 300. Further, the electrode pads 404 of the input/output circuit units 403 which configure the ports P6-1 and P6-2, are not electrically coupled to the pins of the semiconductor device 300.

That is, the electrode pads 404 in the seven input/output circuit units 403 (B0) to 403 (B6) of the eight input/output circuit units which configure the 8-bit port P0-1, are coupled to the pins 42 to 48 of the semiconductor device 300. Also, the electrode pads 404 in the seven input/output circuit units 403 (B9) to 403 (B15) of the eight input/output circuit units which configure the 8-bit port P0-2, are coupled to the pins 33 to 39 of the semiconductor device 300. Further, the electrode pads 404 in the seven input/output circuit units 403 (B0) to 403 (B6) of the eight input/output circuit units which configure the 8-bit port P1-1, are coupled to the pins 26 to 32 of the semiconductor device 300. Moreover, the electrode pads 404 in the seven input/output circuit units 403 (B9) to 403 (B15) of the eight input/output circuits which configure the 8-bit port P1-2, are coupled to the pins 17 to 23 of the semiconductor device 300.

Further, the electrode pads 404 in the six input/output circuit units 403 (B0) to 403 (B5) of the eight input/output circuit units which configure the 8-bit port P2-1, are coupled to the pins 11 to 16 of the semiconductor device 300. The electrode pads 404 in the six input/output circuit units 403 (B10) to 403 (B15) of the eight input/output circuit units which configure the 8-bit port P2-2, are coupled to the pins 1 to 6 of the semiconductor device 300. Moreover, the electrode pads 404 in the seven input/output circuit units 403 (B0) to 403 (B6) of the eight input/output circuit units which configure the 8-bit port P3-1, are coupled to the pins 58 to 64 of the semiconductor device 300. The electrode pads 404 in the seven input/output circuit units 403 (B9) to 403 (B15) of the eight input/output circuit units which configure the 8-bit port P3-2, are coupled to the pins 49 to 55 of the semiconductor device 300.

On the other hand, at the port P4, the electrode pads 404 in the two input/output circuit units 403 (B6) and 403 (B7) of the fourteen input/output circuit units 403 which configure the 14-bit port P4, are coupled to the pins 40 and 41 of the semiconductor device 200. The electrode pads 404 of the remaining twelve input/output circuit units 403 are not coupled to the pins of the semiconductor device 200.

Likewise, even at the 14-bit port P5, the electrode pads 404 of the two input/output circuit units 403 (B6) and 403 (B7) corresponding to the bits (B6) and (B7) being two bits of fourteen bits are coupled to the pins 24 and 25 of the semiconductor device 200. The electrode pads 404 of the twelve input/output circuit units corresponding to the remaining 12 bits are not coupled to the pins of the semiconductor device 300. Further, even at the 14-bit port P7, the electrode pads 404 of the two input/output circuit units 404 (B6) and 403 (B7) corresponding to the bits (B6) and (B7) being two bits of fourteen bits are coupled to the pins 56 and 57 of the semiconductor device 300. The electrode pads 404 of the twelve input/output circuit units 403 corresponding to the remaining twelve bits are not coupled to the pins of the semiconductor device 300.

Even in the 64-pin semiconductor device 300, as shown in FIG. 1, at the side of the semiconductor device 300 opposite to the side E1 of the semiconductor chip CHP, the port P0-1 is assigned to the pins provided on one end side of the side thereof, and the port P0-2 is assigned to the pins provided on the other end side of the side thereof. Further, the port P4 is assigned to the pins arranged in the central portion of the side of the semiconductor device 100, which is opposite to the side E1. Therefore, at the respective ports P0-1, P0-2, and P4, the electrode pads 404 arranged in the semiconductor chip CHP and the pins of the semiconductor device 300 are made opposite to each other. Hence, the electrode pads 404 and the pins of the semiconductor device 300 can easily be coupled to each other by way of wires.

Although the ports P0-1, P0-2, and P4 have been described by way of example, other ports and terminals C1, C2, C3, and C4 are also similar to the above.

Figure 10:
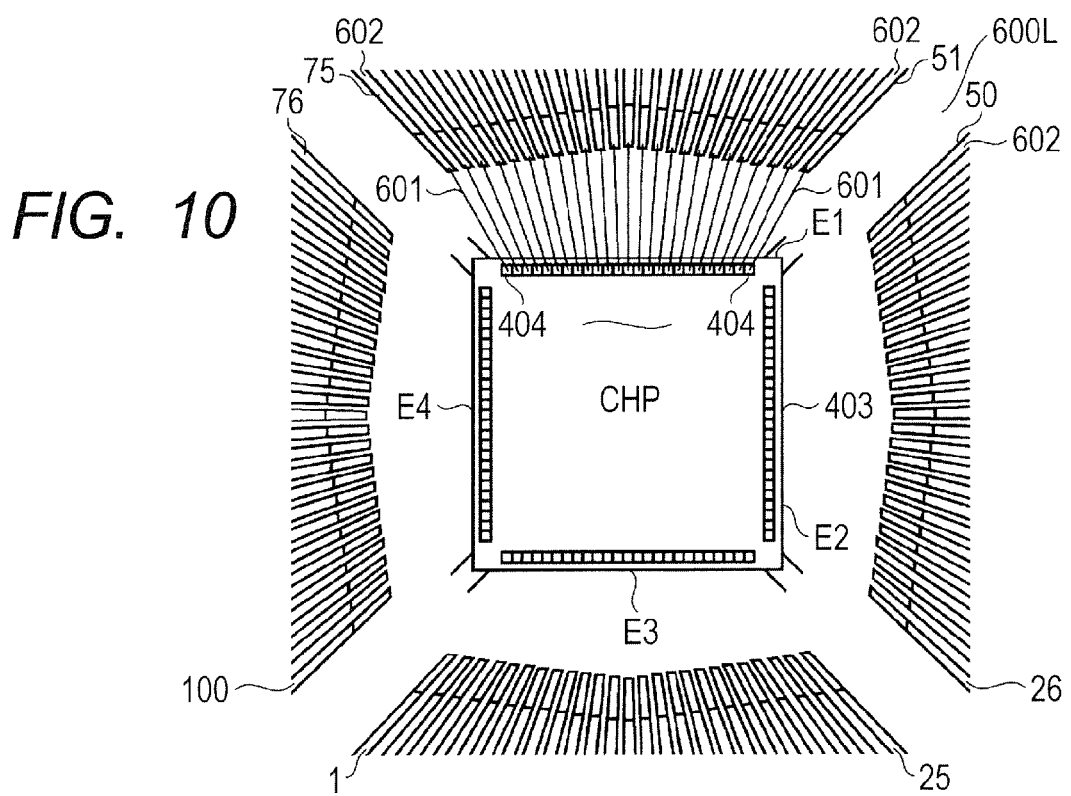
FIG. 10 is a plan diagram showing the plane of a lead frame mounted with the semiconductor chip according to the embodiment 1.

FIG. 10 is a plan diagram showing the plane of a lead frame equipped with the semiconductor chip CHP according to the embodiment 1. Although the 120-pin semiconductor device has been described as the semiconductor device largest in pin number in FIGS. 1, 2, and 4, a 100-pin semiconductor device will be described as the semiconductor device largest in pin number in FIG. 10 by way of example to avoid complication of the drawing.

In FIGS. 1 and 2, in the case of the 120-pin semiconductor device, the ports P4, P5, and P7 have been set to 14 bits, the port P6 has been set to 10 bits, and the ports P0 to P3 have been set to 16 bits, respectively. On the other hand, in the example of FIG. 10 showing the semiconductor device in which the number of pins is made largest as 100 pins, the ports P4, P5, and P7 are respectively set to 9 bits, and the port P6 is set to 6 bits. Even in the example of FIG. 10, the ports P0 to P3 are respectively maintained at 16 bits. Further, the present example is the same as the example of FIG. 1 in that the each of the ports P0 to P3 is configured by two 8-bit ports. When there is provided a semiconductor device small in pin number, the numbers of bits of the ports (ports P4, P5, and P7) arranged between the two ports are preferentially reduced in the same manner as the example of FIG. 1.

With the reduction in the number of bits of each of the ports P4, P5, and P7, the number of the input/output circuit units 403 which configure these ports, is reduced in the semiconductor chip CHP described in FIG. 10. The arrangement of the input/output circuit units 403 described in FIG. 10 is the same as FIG. 4.

In FIG. 10, 600L indicates part of a lead frame of a 100-pin LQF (Low Profile Quad Flat) package having 100 pins. In the same drawing, 602 indicate leads. There are shown a hundred of leads 602. In the same drawing, the leads 602 are given pin numbers of 1 to 100 counterclockwise from the lower left.

As described in FIG. 4, the semiconductor chip CHP has the four sides E1 to E4 and the main surface surrounded by the four sides E1 to E4. Further, the input/output circuit units 403 are arranged along the sides E1 to E4 as shown in FIG. 4. As described in FIG. 4, the electrode pads 404 included in the input/output circuit units 403 are also arranged along the sides E1 to E4. In FIG. 10, the electrode pads 404 arranged along the sides E1 to E4 respectively are shown as rows or columns of the electrode pads arranged in parallel with the sides E1 to E4.

The electrode pads 404 arranged over the main surface of the semiconductor chip CHP are electrically coupled to one ends of their corresponding leads by way of wires 601. Since the drawing becomes complex in FIG. 10, there are drawn only portions where the wires 601 couple between the electrode pads 404 arranged along the side E1 and the leads 602 (pin numbers 51 to 75) opposite to the side E1. Though not shown in FIG. 10, the electrode pads 404 arranged along the sides E2 to E4 and the leads 602 (pin numbers 26 to 50, 1 to 25, and 76 to 100) opposite to the sides E2 to E4 are also electrically coupled to one another by the wires 601.

Figure 8:
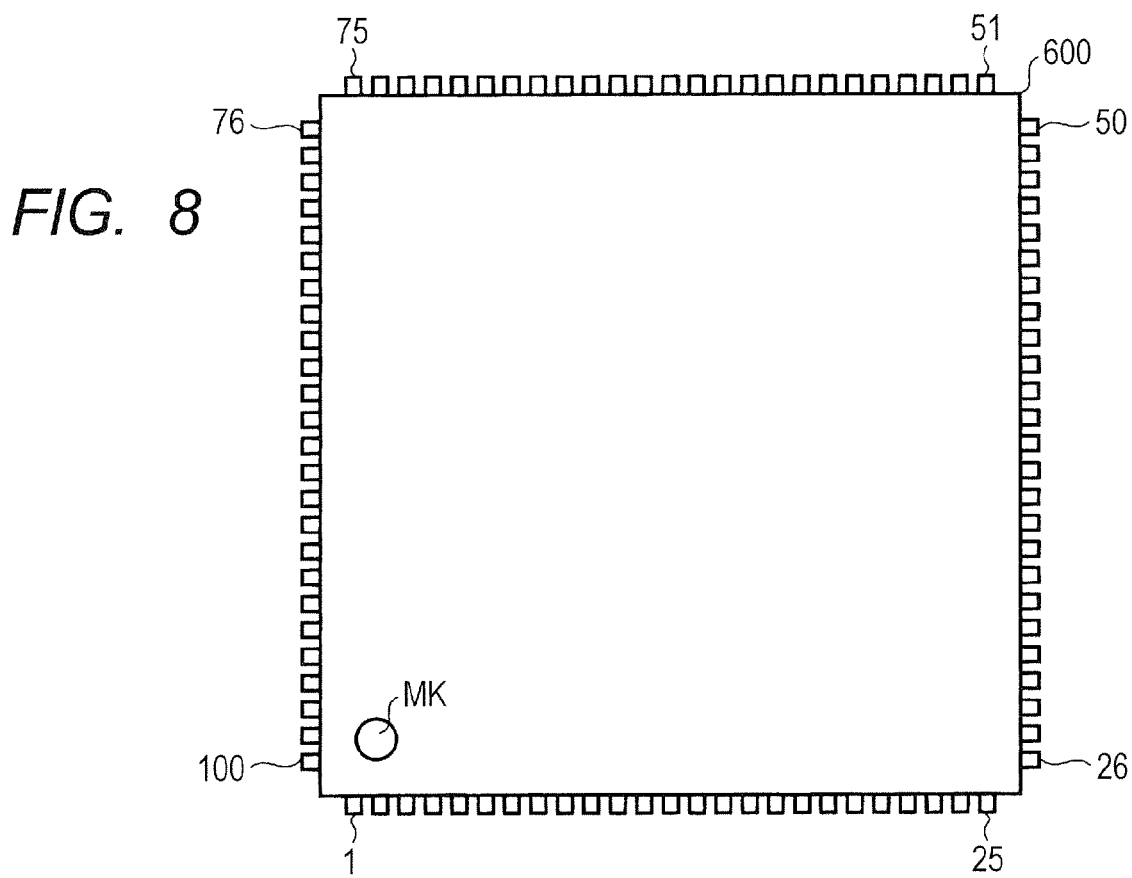
FIG. 8 is a plan diagram showing the plane of the semiconductor device according to the embodiment 1.

After the lead frame 600L, and the electrode pads 404 arranged at the peripheral edge portions of the semiconductor chip CHP are electrically coupled by the wires 601, they are packaged into the 100-pin LQF package. At this time, the other end portions of the leads 602 are packaged so as to protrude outside the package. The semiconductor device placed in a state of being packaged in the 100-pin LQF package is shown as 600 in FIG. 8. In FIG. 8, MK indicates a mark attached to the package. The other ends of the leads 602 are protruded from the respective sides of the package as shown in FIG. 8 and serve as terminals (pins) of the semiconductor device. Further, in the same figure, 1, 25, 26, 50, 51, 75, 76, and 100 indicate the protruded ends of the leads 602, i.e., the pin's numbers of the semiconductor device.

The input/output circuit units 403 are arranged over the main surface of the semiconductor chip CHP along the sides E1 to E4, and the electrode pads 404 are arranged thereover along the sides E1 to E4. The respective electrode pads 404 are coupled to their corresponding leads 602 by the wires 601 and packaged into the package, thereby making it possible to provide a semiconductor device in which the 100-pin LQF package is configured as a package. In this case, the ports P0 to P3 are respectively separated into the two ports and assigned to the pins of the semiconductor device. Even in the semiconductor chip CHP, however, the input/output circuit units 403 (including the electrode pads 404) which respectively configure the ports P0 to P3, are separated into two in like manner as described in FIG. 4. Therefore, as shown in FIG. 10, the electrode pads 404 and one ends of their corresponding leads 601 can easily be coupled by the wires 602.

Figure 11:
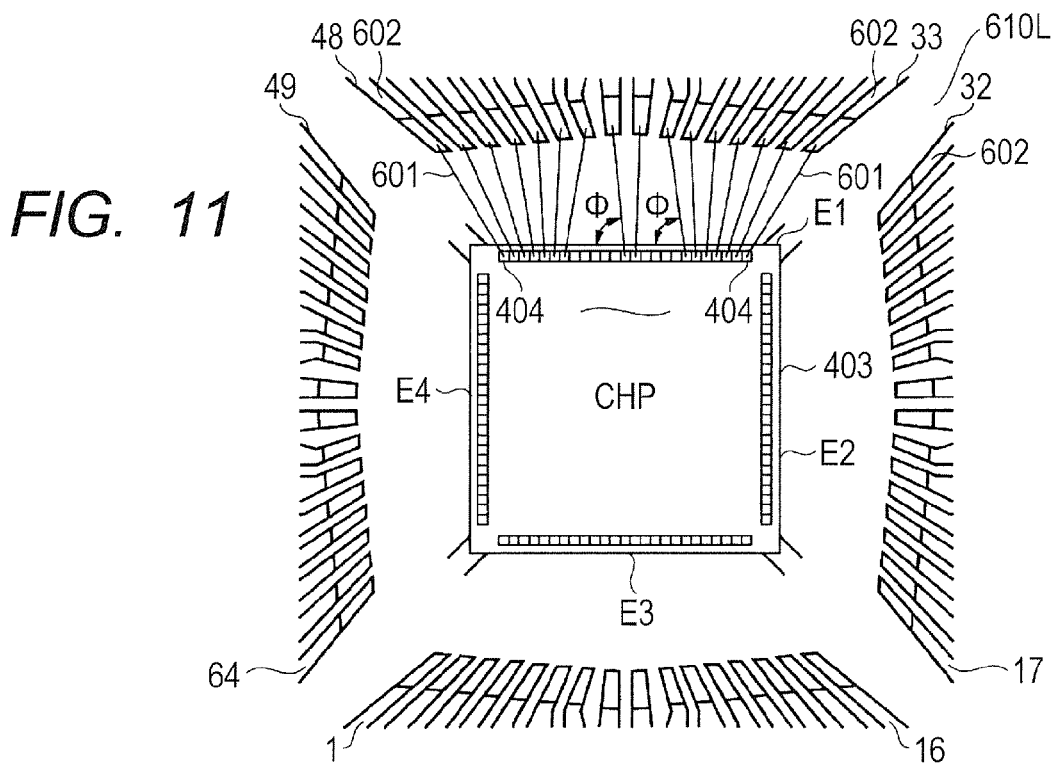
FIG. 11 is a plan diagram showing the plane of a lead frame mounted with the semiconductor chip according to the embodiment 1.

FIG. 11 is a plan diagram showing the plane of a lead frame equipped with the semiconductor chip CHP according to the embodiment 1. There is shown in FIG. 11, where the semiconductor chip CHP having the same configuration as the semiconductor chip CHP shown in FIG. 10 is packaged into a 64-pin LQF package by type development.

Since the number of pins in the semiconductor device becomes 64, as shown in FIG. 2, the ports P0, P1, and P3 become 14 bits, the port P2 becomes 12 bits, the ports P4, P5, and P7 become 2 bits, and the port P6 becomes 0 bits, respectively.

Figure 9:
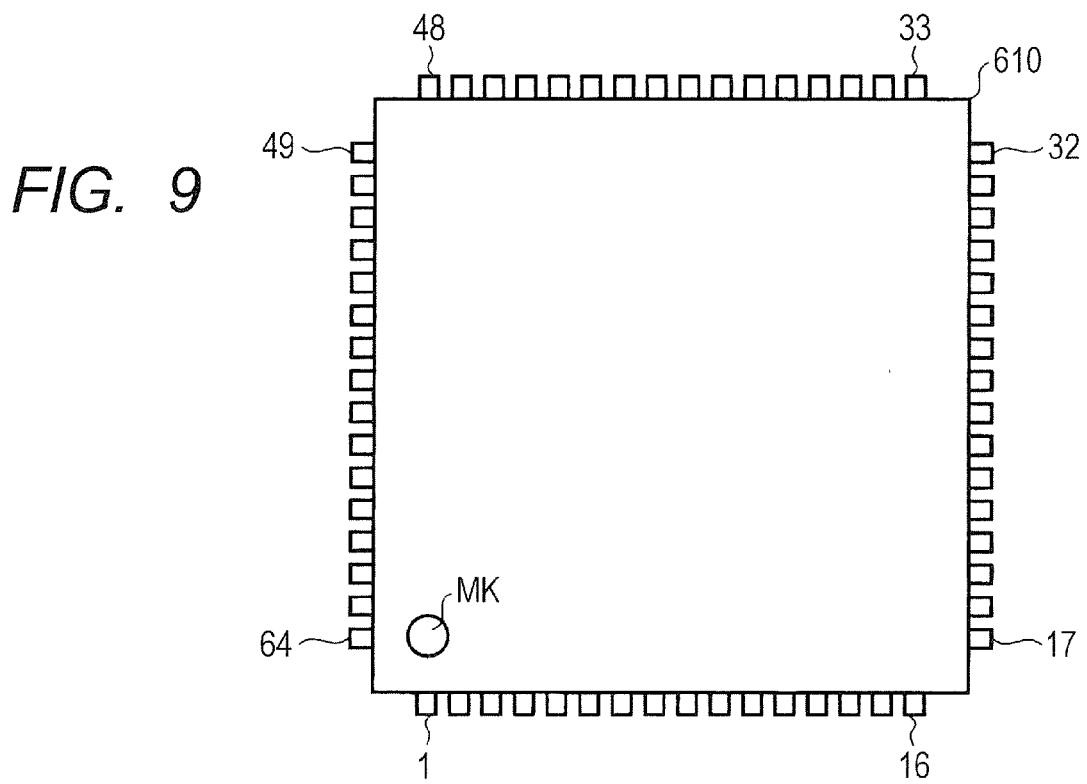
FIG. 9 is a plan diagram showing the plane of the semiconductor device according to the embodiment 1.

There is shown in FIG. 11, only a portion where the electrode pads 404 arranged along the side E1 of the semiconductor chip CHP and their corresponding leads 602 (pin numbers 33 to 48) are coupled by way of wires 601 as with FIG. 10. Although the remaining leads 602 are also coupled to their corresponding electrodes, they are omitted in the same drawing. After the leads 602 and the semiconductor chip CHP are coupled to each other by the wires 601, they are packaged into a package, whereby a semiconductor device 610 placed in a state of being packaged into the 64-pin LQF package such as shown in FIG. 9 is provided. In FIG. 9, MK indicates a mark attached to the package. The other ends of the leads 602 protrude from the sides of the package as shown in FIG. 9 and hence serve as terminals (pins) of the semiconductor device. Further, in the same figure, 1, 16, 17, 32, 33, 48, 49, and 64 indicate the protruded ends of the leads 602, i.e., pin's numbers of the semiconductor device.

In FIG. 11, the electrode pads 404 and their corresponding leads 602 (pin numbers 33 to 48) both coupled by the wires 601 will next be described by way of example.

As shown in FIG. 4, the input/output circuit units 403 (B0) to 403 (B7) of the second group which configures the port P0-1, the input/output circuit units 403 of the fourth group which configures the port P4, and the input/output circuit units 403 (B8) to 403 (B15) of the third group which configures the port P0-2, are arranged along the side E1 of the semiconductor chip CHP. In this case, the input/output circuit units 403 of the fourth group which configures the port P4, are arranged between the input/output circuit units 403 (B0) to 403 (B7) of the second group, and the input/output circuit units 403 (B8) to 403 (B15) of the third group. When viewed at the electrode pads 404, the electrode pads (fourth electrode pads) in the input/output circuit units 403 of the fourth group which configures the port P4, are arranged between the electrode pads 404 (second electrode pads) in the input/output circuit units 403 (B0) to 403 (B7) of the second group and the electrode pads 404 (third electrode pads) in the input/output circuit units 403 (B8) to 403 (B15) of the third group.

When a semiconductor device small in pin number is provided upon the type development, the numbers of bits of the ports P0 to P3 are maintained preferentially with respect to the ports P4 to P7. In other words, the number of bits of each of the ports P4 to P7 is preferentially reduced.

As shown in FIG. 1, the port P0 is assigned by being divided into two at the side of the semiconductor device corresponding to the side E1 of the semiconductor chip CHP. That is, the port P0 is comprised of the port P0-1 assigned to the pins on the left side of the semiconductor device, and the port P0-2 assigned to the pins on the right side of the semiconductor device in FIG. 1. Further, the port P4 is assigned to the pins between the ports P0-1 and P0-2.

In order to reduce the number of bits of the port P4 where the 64-pin semiconductor device is provided, the input/output circuit units arranged in the central portion of the side E1 of the semiconductor chip CHP, of the input/output circuit units 403 which configure the port P4, are left, and no coupling is performed between the electrode pads 404 in the input/output circuit units other than the above, and the leads 602. Thus, it is possible to provide the semiconductor device small in pin number while suppressing a reduction in the number of bits of the port P0 comprised of the ports P0-1 and P0-2.

Further, the input/output circuit units 403 configuring the port P0-1 of the ports P0-1 and P0-2 which configure the port P0, are arranged on the left side along the side E1 of the semiconductor chip CHP. The input/output circuit units 403 which configure the port P0-2, are arranged on the right side along the side E1 of the semiconductor chip CHP. That is, the input/output circuit units 403 which configure the port P0-1, and the pins of the semiconductor device to which the port P0-1 is assigned, are made opposite to each other. The input/output circuit units 403 which configure the port P0-2, and the pins of the semiconductor device to which the port P0-2 is assigned, are made opposite to each other. Further, when a semiconductor small in pin number is provided, the electrode pads 404 of the input/output circuit units 403 arranged in the central portion of the side E1, of the input/output circuit units 403 which configure the port P4, are coupled to their corresponding leads 602.

Thus, at both end sides of the side E1, an approach angle φ (angle between the side E1 and the wire 601) of the wire 601 for coupling the lead 602 and the electrode pad 404, and an approach angle φ of the wire 601 for coupling the lead 602 and the electrode pad 404 in the central portion of the side E1 can be prevented from being reduced. There is a risk of contact between the wires 601 when the approach angle φ of the wire 601 is small, and there is hence a possibility of occurrence in malfunction. Further, the wire 601 is considered to be long when the approach angle φ is small, so that there is a fear of degradation in characteristics.

Although the ports P0 and P4 arranged along the side E1 have been described by way of example, the ports P1 to P3 and P5 to P7 arranged along other sides E2 to E4 are also similar to the above.

In the embodiment 1, even when the semiconductor device small in pin number is provided by type development, it is possible to suppress a decrease in the number of bits of each of the ports where the input or output can be taken temporally in parallel by one access. For example, when the 80-pin semiconductor device is provided as shown in FIG. 2, it is possible to maintain the ports where the 16-bit input/output can be done by one access as with the 120-pin semiconductor device. Further, even when the 64-pin semiconductor device is provided, it is possible to maintain the ports where the 14-bit input/output can be done at maximum by one access. That is, even if the semiconductor chip CHP is stored in the package small in pin number, it is possible to minimize a reduction in the number of bits of each of the ports to which the microcontroller CPU can get access at a time. Further, the same ports can be gathered on one side of the semiconductor device without being dispersed to the plural sides of the semiconductor device. It is therefore possible to provide the semiconductor device excellent in usability.

Incidentally, although the embodiment 1 has described the ports arranged at the four sides of the semiconductor chip CHP and the semiconductor device, the ports (e.g., ports P0-1, P0-2, and P4) may be configured to be arranged only at one side of each of the semiconductor chip CHP and the semiconductor device in, for example, a semiconductor device or the like equipped with a high-accuracy analog function or the like and intended for applications for which it is difficult to be used as ports. That is, no limitation is imposed on the number of the sides at which the ports are arranged.

Further, the ports each having the input and output have been described as the ports by way of example in the embodiment 1, but the embodiment 1 is not limited to such ports. That is, the ports may be configured as input exclusive ports or output exclusive ports.

Further, when the electrode pads of the semiconductor chip CHP and the pins of the semiconductor device are more increased, e.g., in a case like 208 pins, an additional first port where the input or/and output can be taken temporally in parallel by one access may be provided and configured by second and third ports, followed by being added to the ports P0 and P4 shown in FIG. 1. In this case, the ports P0-1, P4, and P0-2 shown in FIG. 1 may be sandwiched between the second and third ports. That is, the ports where the input or/output can be done by one access may be divided into plural forms and arranged to be added sequentially.

Embodiment 2

Figure 5:
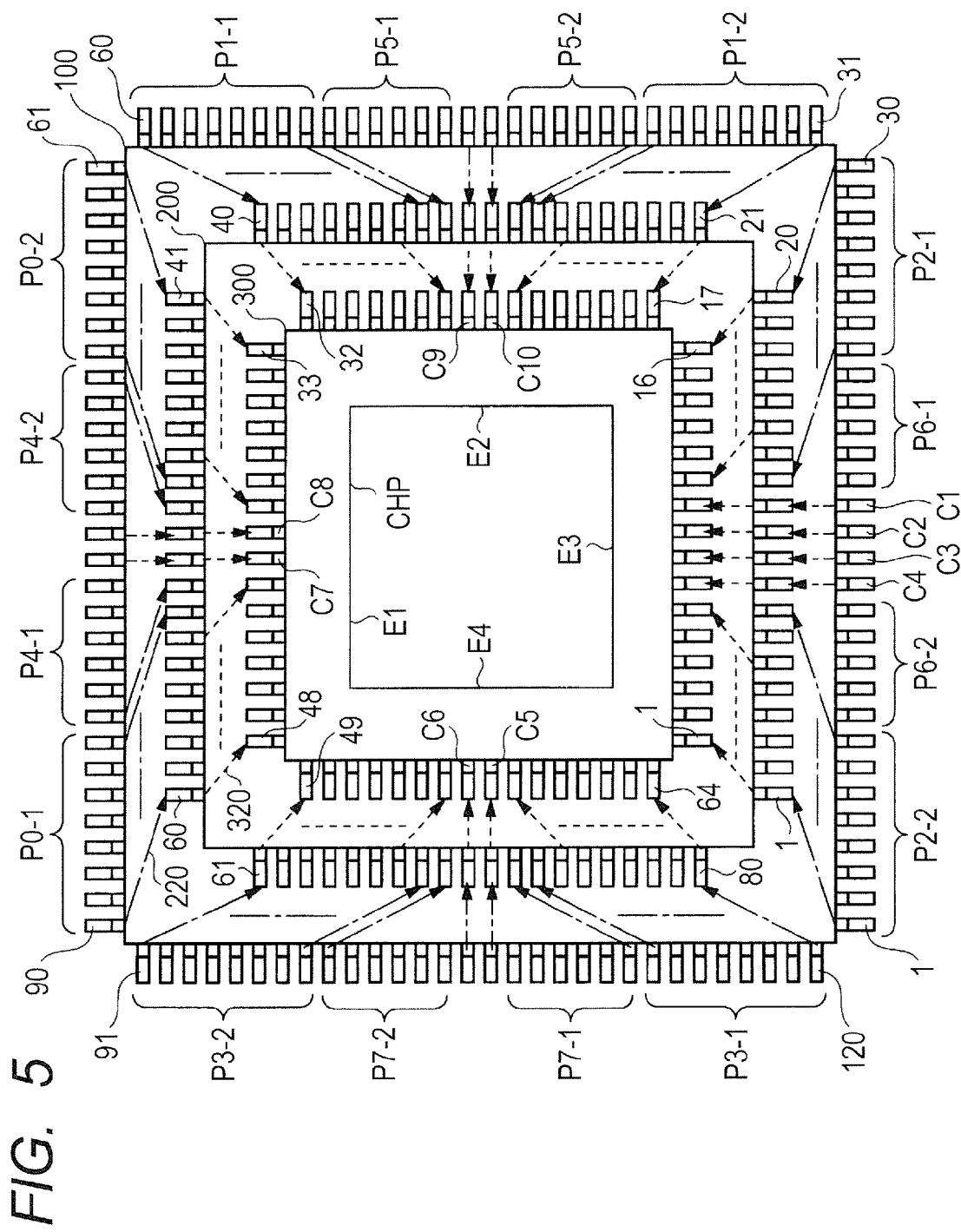
FIG. 5 is a typical plan diagram showing the configuration of a semiconductor device according to an embodiment 2.
Figure 6:
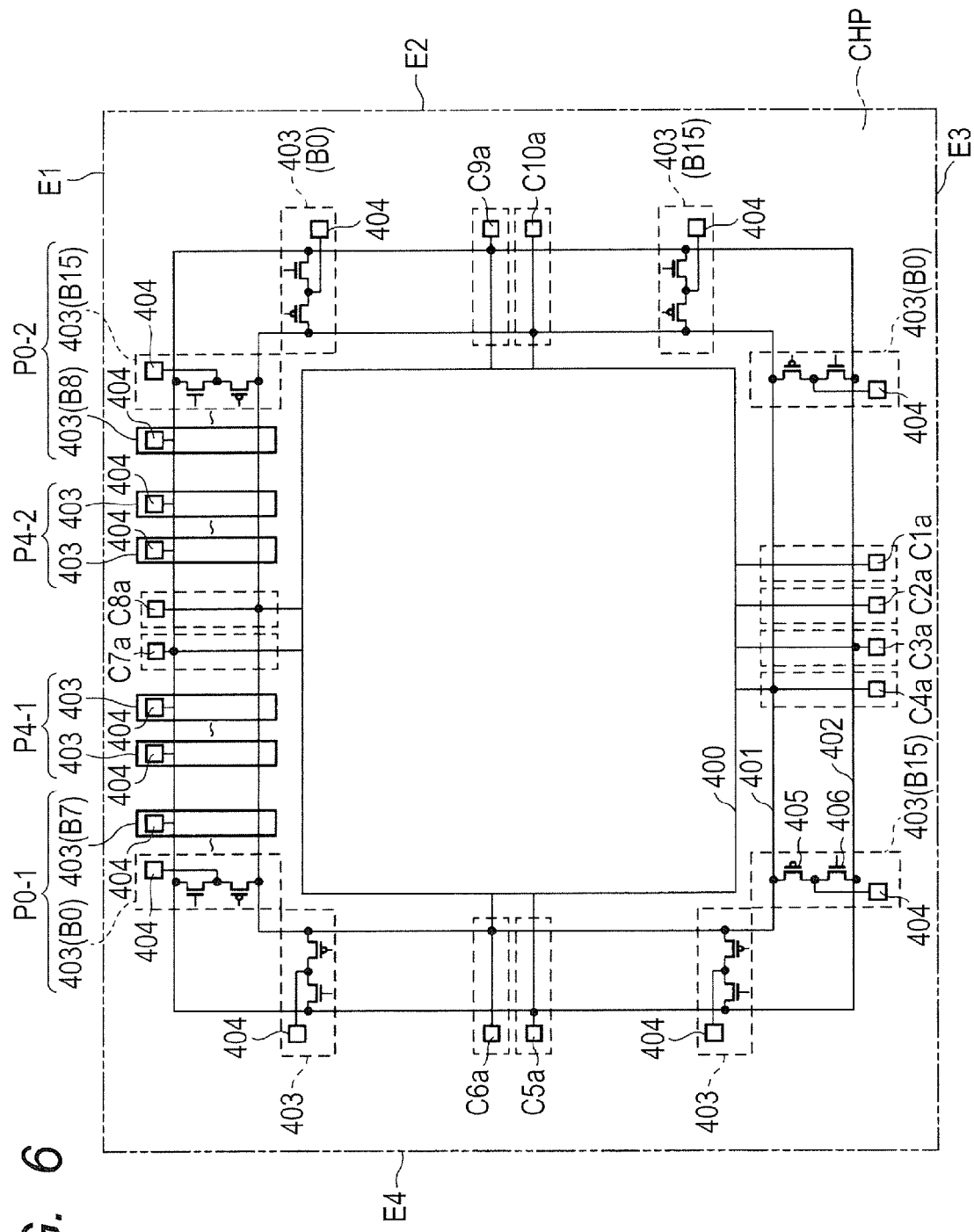
FIG. 6 is a plan diagram typically showing the structure of a semiconductor chip according to the embodiment 2.

FIG. 5 is a plan diagram typically showing the configuration of a semiconductor device according to an embodiment 2. Further, FIG. 6 is a plan diagram typically showing the structure of a semiconductor chip CHP according to the embodiment 2. The semiconductor device shown in FIG. 5 is similar in configuration to the semiconductor device shown in FIG. 1. The semiconductor chip CHP shown in FIG. 6 is similar in structure to the semiconductor chip shown in FIG. 4. Therefore, a description will principally be made about points of difference therebetween herein.

<Configuration of Semiconductor Device>

In the embodiment 2, the ports P4, P5, and P7 described in the embodiment 1 are respectively divided into two ports.

Further, in the embodiment 2, a power supply voltage terminal is added to the semiconductor device.

In FIG. 5, P4-1 and P4-2 are ports. The port P4 described in the embodiment 1 is comprised of the two ports P4-1 and P4-2. In the embodiment 1, however, the port P4 is 14 bits in the case of the 120-pin semiconductor device, but a 12-bit port P4 reduced by two bits is configured by the ports P4-1 and P4-2 in the embodiment 2. In the case of the 120-pin semiconductor device, the port P4 configured by the ports P4-1 and P4-2 is capable of performing 12-bit input or output temporally in parallel by one access.

Also, P5-1 and P5-2 are ports. The port P5 described in the embodiment 1 is configured by the two ports P5-1 and P5-2. In the embodiment 1, however, the port P5 is 14 bits in the case of the 120-pin semiconductor device, but a 12-bit port P5 reduced by two bits is configured by the ports P5-1 and P5-2 in the embodiment 2. In the case of the 120-pin semiconductor device, the port P5 configured by the ports P5-1 and P5-2 is capable of performing 12-bit input or output temporally in parallel by one access.

Further, P7-1 and P7-2 are ports. The port P7 described in the embodiment 1 is configured by the two ports P7-1 and P7-2. In the embodiment 1, however, the port P7 is 14 bits in the case of the 120-pin semiconductor device, but a 12-bit port P7 reduced by two bits is configured by the ports P7-1 and P7-2 in the embodiment 2. In the case of the 120-pin semiconductor device, the port P7 configured by the ports P7-1 and P7-2 is capable of performing 12-bit input or output temporally in parallel by one access.

In the case of the 120-pin semiconductor device 100, the port P4-1 is assigned to its corresponding pins 77 to 82 of the semiconductor device 100, and the port P4-2 is assigned to its corresponding pins 69 to 74 of the semiconductor device 100. In the case of the 80-pin semiconductor device 200, the port P4-1 is assigned to the pin 52 of the semiconductor device 200, and the port P4-2 is assigned to the pin 49 of the semiconductor device 200. Further, in the case of the 64-pin semiconductor device 300, the ports P4-1 and P4-2 are not assigned to the pins of the semiconductor device 300.

A power supply voltage terminal C8 and a ground voltage terminal C7 are respectively assigned to the pins between the pin to which the port P4-1 is assigned and the pin to which the port P4-2 is assigned. That is, in the case of the 120-pin semiconductor device 100, the power supply voltage terminal C8 and the ground voltage terminal C7 are assigned to their corresponding pins 75 and 76 of the semiconductor device 100. In the case of the 80-pin semiconductor device 200, the power supply voltage terminal C8 and the ground voltage terminal C7 are assigned to their corresponding pins 50 and 51 of the semiconductor device 200. In the case of the 64-pin semiconductor device 300, the ports P4-1 and P4-2 are not assigned. In place of the ports P4-1 and P4-2, the power supply voltage terminal C8 and the ground voltage terminal C7 are assigned to their corresponding pins 40 and 41 of the semiconductor device 300.

Likewise, in the case of the 120-pin semiconductor device 100, the port P5-1 is assigned to its corresponding pins 47 to 52 of the semiconductor device 100, and the port P5-2 is assigned to its corresponding pins 39 to 44 of the semiconductor device 100. In the case of the 80-pin semiconductor device 200, the port P5-1 is assigned to its corresponding pin 32 of the semiconductor device 200, and the port P5-2 is assigned to its corresponding pin 29 of the semiconductor device 200. Further, in the case of the 64-pin semiconductor device 300, the ports 5-1 and P5-2 are not assigned to the pins of the semiconductor device 300.

A power supply voltage terminal C10 and a ground voltage terminal C9 are respectively assigned to the pins between the pin to which the port P5-1 is assigned and the pin to which the port P5-2 is assigned. That is, in the case of the 120-pin semiconductor device 100, the power supply voltage terminal C10 and the ground voltage terminal C9 are assigned to their corresponding pins 45 and 46 of the semiconductor device 100. In the case of the 80-pin semiconductor device 200, the power supply voltage terminal C10 and the ground voltage terminal C9 are assigned to their corresponding pins 30 and 31 of the semiconductor device 200. In the case of the 64-pin semiconductor device 300, the ports P5-1 and P5-2 are not assigned. Instead of the ports P5-1 and P5-2, the power supply voltage terminal C10 and the ground voltage terminal C9 are assigned to their corresponding pins 24 and 25 of the semiconductor device 300.

Further, in the case of the 120-pin semiconductor device 100, the port P7-1 is assigned to its corresponding pins 107 to 112 of the semiconductor device 100, and the port P7-2 is assigned to its corresponding pins 99 to 104 of the semiconductor device 100. In the case of the 80-pin semiconductor device 200, the port P7-1 is assigned to its corresponding pin 72 of the semiconductor device 200, and the port P7-2 is assigned to its corresponding pin 69 of the semiconductor device 200. Further, in the case of the 64-pin semiconductor device 300, the ports 7-1 and P7-2 are not assigned to the pins of the semiconductor device 300.

A power supply voltage terminal C6 and a ground voltage terminal C5 are respectively assigned to the pins between the pin to which the port P7-1 is assigned and the pin to which the port P7-2 is assigned. That is, in the case of the 120-pin semiconductor device 100, the power supply voltage terminal C6 and the ground voltage terminal C5 are assigned to their corresponding pins 105 and 106 of the semiconductor device 100. In the case of the 80-pin semiconductor device 200, the power supply voltage terminal C6 and the ground voltage terminal C5 are assigned to their corresponding pins 70 and 71 of the semiconductor device 200. In the case of the 64-pin semiconductor device 300, the ports P7-1 and P7-2 are not assigned. Instead of the ports P7-1 and P7-2, the power supply voltage terminal C6 and the ground voltage terminal C5 are assigned to their corresponding pins 56 and 57 of the semiconductor device 300.

When the semiconductor device small in pin number is provided as with the embodiment 1, the pins of the semiconductor device to which the ports P0 to P7, the reset input terminal C1, the clock input terminal C2, and the power supply voltage terminals C3 to C10 are respectively assigned, are changed as indicated by dashed lines 220 with arrows or broken lines 320 with arrows.

<Configuration of Semiconductor Chip>

Since the port P4 is changed to 12 bits in the semiconductor chip CHP according to the embodiment 2, the number of input/output circuit units 403 which configure the port P4, is changed from 14 to 12. The port P4-1 is configured by six input/output circuit units 403, and the port P4-2 is configured by the remaining six input/output circuit units 403. Although not limited in particular in this case, the ports P4-1 and P4-2 are respectively configured by input/output circuit units 403 arranged continuously. In FIG. 6, C7a and C8a are electrode pads arranged along the side E1 of the semiconductor chip CHP. The electrode pads C7a and C8a are arranged between electrode pads 404 in the input/output circuit units 403 which configure the port P4-1 and electrode pads 404 in the input/output circuit units 403 which configure the port P4-2.

The electrode pad C7a is coupled to a power supply wiring 402 and an internal circuit 400, and the electrode pad C8a is coupled to a power supply wiring 401 and the internal circuit 400. The electrode pad C7a is coupled to the ground voltage terminal C7 by a wire, and the electrode pad C8a is coupled to the power supply voltage terminal C8 by a wire.

Even at the ports P5 and P7, the number of bits thereof is change to 12 bits. Therefore, the number of input/output circuit units 403 which configure the ports P5 and P7 respectively is changed from 14 to 12. As with the port P4, the ports P5-1 and P7-1 are respectively configured by six input/output circuit units 403, and the ports P5-2 and P7-2 are respectively configured by the remaining six input/output circuit units 403. As with the ports P4-1 and P4-2, the ports P5-1 and P5-2 (ports P7-1 and P7-2) are respectively configured by the input/output circuit units 403 arranged continuously.

In FIG. 6, C9a and C10a are electrode pads arranged along the side E2 of the semiconductor chip CHP. The electrode pads C9a and C10a are arranged between electrode pads 404 in the input/output circuit units 403 which configure the port P5-1, and electrode pads 404 in the input/output circuit units 403 which configure the port P5-2.

The electrode pad C9a is coupled to the power supply wiring 402 and the internal circuit 400, and the electrode pad C10a is coupled to the power supply wiring 401 and the internal circuit 400. The electrode pad C9a is coupled to the ground voltage terminal C9 by a wire, and the electrode pad C10a is coupled to the power supply voltage terminal C10 by a wire.

Further, in FIG. 6, C5a and C6a are electrode pads arranged along the side E4 of the semiconductor chip CHP. The electrode pads C5a and C6a are arranged between electrode pads 404 in the input/output circuit units 403 which configure the port P7-1, and electrode pads 404 in the input/output circuit units 403 which configure the port P7-2.

The electrode pad C5a is coupled to the power supply wiring 402 and the internal circuit 400, and the electrode pad C6a is coupled to the power supply wiring 401 and the internal circuit 400. The electrode pad C5a is coupled to the ground voltage terminal C5 by a wire, and the electrode pad C6a is coupled to the power supply voltage terminal C6 by a wire.

In the present embodiment 2, the electrode pads C3a, C4a to C9a, and C10a coupled to the power supply wirings 401 and 402 are arranged at the sides E1 to E4 of the semiconductor chip CHP. The electrode pads C3a to C10a are coupled to the ground voltage terminal and the power supply voltage terminal of the semiconductor device. Thus, even when a load is coupled to the port of the semiconductor device and a relatively high current is made to flow through the load, a voltage drop generated due to the resistances of the voltage wirings 401 and 402 can be reduced. For example, when an LED (Light Emitting Diode) is coupled to the port of the semiconductor device as a load, a current of a few tens of mA is required to drive the LED. It is considered that when the voltage wirings 401 and 402 are being coupled to a ground voltage and a power supply voltage through, for example, one electrode (C3a, C4a), a voltage drop generated in the voltage wirings 401 and 402 becomes large due to the current for driving the LED, so that the voltage applied to the LED is lowered, thus resulting in the difficulty in driving the LED.

Further, in the present embodiment 2, the electrode pads C3a to C10a supplied with the power supply voltage and the ground voltage are respectively arranged in the central portions of the sides E1 to E4 of the semiconductor chip CHP. The electrode pads C7a and C8a arranged along the side E1 of the semiconductor chip CHP will be described by way of example. These electrode pads are arranged between the electrode pads 404 in the input/output circuit units 403 which configure the ports P0-1 and P4-1, and the electrode pads 404 in the input/output circuit units 403 which configure the ports P0-2 and P4-2. Therefore, the electrode pads C7a and C8a are arranged in the central portion of the side E1. Thus, when the semiconductor device small in pin number is provided as described in FIG. 11, it is possible to prevent the wires from contacting with each other and becoming long.

Even in the embodiment 2 as with the embodiment 1, it is possible to minimize a reduction in the number of bits of each port to which the microcontroller CPU can get access at a time, when the semiconductor device small in pin number is provided. Also, it is possible to provide the ports each having sufficient current driving capability in the embodiment 2. Further, the ports at which access is possible at a time can be gathered on one side of the semiconductor device without being dispersed between the sides of the semiconductor device. It is thus possible to provide the semiconductor device excellent in usability.

Even in the embodiment 2 as with the embodiment 1, the ports (e.g., ports P0-1, P0-2, and P4) may be configured to be arranged only at one side of each of the semiconductor chip CHP and the semiconductor device. That is, no limitation is imposed on the number of the sides at which the ports are arranged. Further, the ports have been described as the ports each having the input and output by way of example, but are not limited thereto. That, the ports may be configured as input exclusive ports or output exclusive ports.

Further, when the electrode pads of the semiconductor chip CHP and the pins of the semiconductor device are more increased, e.g., in a case like 208 pins, an additional first port where the input or/and output can be taken temporally in parallel by one access may be provided and configured by second and third ports, followed by being added to the ports P0 and P4 shown in FIG. 5. In this case, the ports P0-1, P4, and P0-2 shown in FIG. 4 may be sandwiched between the second and third ports. That is, the ports where the input or/output can be done by one access may be divided into plural forms and arranged to be added sequentially.

Embodiment 3

Figure 7:
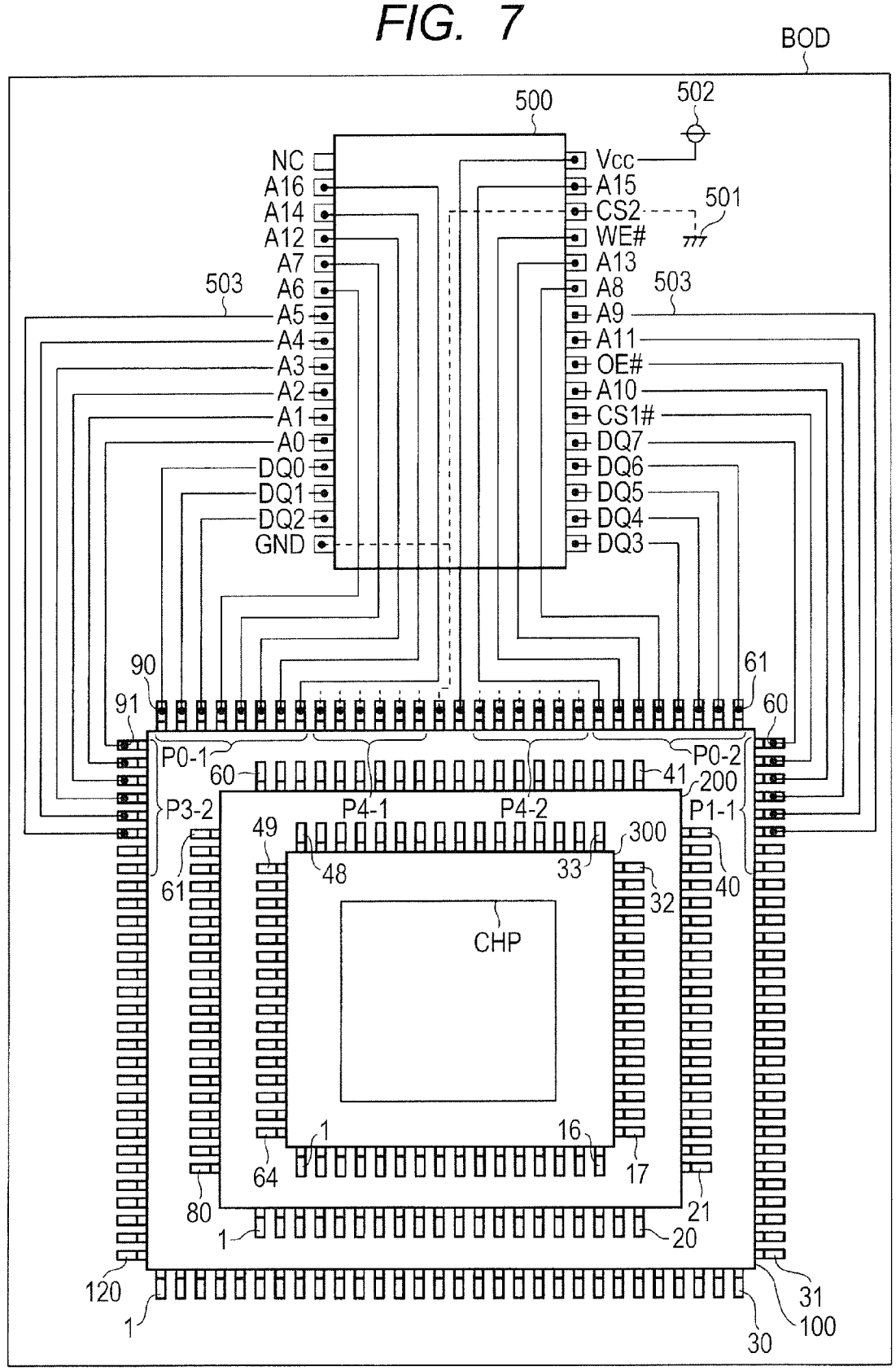
FIG. 7 is a plan diagram showing the configuration of an electronic apparatus according to an embodiment 3.

FIG. 7 is a plan diagram showing the configuration of an electronic apparatus according to an embodiment 3. Here, the electronic apparatus includes a semiconductor device having a microcontroller CPU built therein, and a semiconductor memory accessed by the microcontroller CPU.

In FIG. 7, BOD indicates a board, and 500 indicates a semiconductor memory mounted over the board BOD. Although not limited in particular, a static type semiconductor memory is illustratively shown as the semiconductor memory 500. In the same figure, 100, 200, and 300 indicate semiconductor devices. The semiconductor devices 100, 200, and 300 are provided by type development. Any one of the provided semiconductor devices 100, 200 or 300 is mounted over the board BOD according to the cost of the electronic apparatus and/or the function required by the electronic apparatus.

The semiconductor devices 100, 200, and 300, and a semiconductor chip CHP both shown in FIG. 7 are the same as the embodiment 2. Therefore, the description of the semiconductor devices 100, 200, and 300, and the semiconductor chip CHP will be omitted except for the parts necessary for convenience of explanation.

The semiconductor memory 500 is equipped with a power supply voltage terminal Vcc, a ground voltage terminal GND, address input terminals A0 to A16, data input/output terminals DQ0 to DQ7, chip select terminals CS1# and CS2, a write enable terminal WE#, an output enable terminal OE#, and a non-connect terminal NC.

Here, the non-connect terminal NC means a terminal to which no function is assigned. Further, the chip select terminals CS1# and CS2 are terminals each supplied with a signal for selecting the semiconductor memory 500. The semiconductor memory 500 is selected by supplying a selection signal of a low level to the chip select terminal CS#1 or supplying a selection signal of a high level to the chip select terminal CS2. Since the chip select terminal CS2 is coupled to a ground voltage 501 in FIG. 7, whether to select the semiconductor memory 500 is determined depending on the voltage of the selection signal supplied to the chip select terminal CS1#. The power supply voltage terminal Vcc of the semiconductor memory 500 is coupled to a power supply voltage 502, and the ground voltage terminal GND is coupled to the ground terminal 501. Since the operation of the static type semiconductor memory is known, the operation of the semiconductor memory 500 will be omitted.

The board BOD is a multilayer wiring board having a first wiring layer and a second wiring layer. In the same figure, 503 indicates wirings formed in the first wiring layer of the board BOD. Terminals (pins) of the semiconductor memory 500 and terminals (pins) of the semiconductor device 300, 200 or 100 are coupled to each other by the wirings 503 formed in the first wiring layer. A description will first be made here about the case where the 120-pin semiconductor device 100 is mounted over the board BOD and coupled to the semiconductor memory 500.

The data input/output terminals DQ0 to DQ2 and the address input terminals A6, A7, A12, A14, and A16 of the semiconductor memory 500 are coupled to the port P0-1 of the semiconductor device 100 by the wirings 503 of the first wiring layer. Further, the data input/output terminals DQ3 to DQ6, address input terminals A8, A13, and A15 and write enable terminal WE# of the semiconductor memory 500 are coupled to the port P0-2 of the semiconductor device 100 by the wirings 503 of the first wiring layer.

Also, the address input terminals A0 to A5 of the semiconductor memory 500 are coupled to the port P3-2 of the semiconductor device 100 by the wirings 503 of the first wiring layer. The data input/output terminal DQ7, address input terminals A9, A10, and A11, chip select terminal CS1#, and output enable terminal OE# of the semiconductor memory 500 are coupled to the port P1-1 by the wirings 503 of the first wiring layer.

Further, the power supply voltage terminal C8 of the semiconductor device 100 and the power supply voltage terminal Vcc of the semiconductor memory 500 are coupled to the power supply voltage 502 by the wirings 503 of the first wiring layer. Besides, the ground voltage terminal C7 of the semiconductor device 100, and the ground voltage terminal GND and chip select terminal CS2 of the semiconductor memory 500 are coupled to the ground voltage 501 by wirings formed in the second wiring layer. Incidentally, in FIG. 7, the wirings formed in the second wiring layer are indicated by broken lines, and the wirings 503 formed in the first wiring layer are indicated by solid lines. Further, in order to avoid complication of the drawing for the wirings formed in the first wiring layer, reference numerals 503 are attached only to the wirings coupled to the address input terminals A5 and A9 of the semiconductor memory 500, and no reference numerals are attached to the remaining wirings of the first wiring layer.

Then, the ports P4-1 and P4-2 of the semiconductor device 100 are coupled to the wirings formed in the second wiring layer and coupled to other components mounted over the board BOD.

Other ports P1-2, P2-1, P2-2, P3-1, P5-1, P5-2, P6-1, P6-2, P7-1, and P7-2 of the semiconductor device 100 are also coupled to other components mounted over the board BOD, but their coupling is omitted in FIG. 7. Further, the power supply voltage terminals C4, C6, and C10, and the ground voltage terminals C3, C5, and C9 are coupled to the power supply voltage 502 and the ground voltage 501. The clock input terminal C2 and the reset input terminal C1 are also coupled to other components mounted over the board BOD, but omitted in FIG. 7.

In the present embodiment 3, when the semiconductor device small in pin number is provided, the address input terminals, data input/output terminals and control terminals (WE#, CS1#, OE#) of the semiconductor memory 500 are coupled to the ports P0-1, P0-2, P1-1, and P3-2 of the ports P0 (P0-1, P0-2), P1 (P1-1, P1-2), P2 (P2-1, P2-2), and P3 (P3-1, P3-2) at which the number of bits is preferentially maintained. Therefore, the ports P0-1, P0-2, P1-1, and P3-2 exist even if the 80-pin semiconductor device 200 or the 64-pin semiconductor device 300 is used in place of the 120-pin semiconductor device 100.

Further, when the semiconductor device small in pin number is provided, the ports (e.g., ports P4-1 and P4-2) at which the number of bits is preferentially reduced, are arranged between the ports (ports P0-1 and P0-2) at which the number of bits is preferentially maintained. Therefore, even if the number of bits of each of the ports P4-1 and P4-2 is reduced, the bit arrangement of each of the ports P0-1 and P0-2 is maintained. That is, the arrangement of bits in each port is maintained even in the semiconductor devices 200 and 300 small in pin number. Thus, even when the semiconductor devices 200 and 300 small in pin number are used instead of the semiconductor device 100 large in pin number, the positional relationship between the semiconductor device and the semiconductor memory 500 becomes constant. Incidentally, when the semiconductor device 300 is used, each of the ports P0-1 and P0-2 becomes 7 bits, and the pins coupled to the address input terminals A15 and A16 of the semiconductor memory 500 do not exist in the semiconductor device 300. In this case, the address input terminals A15 and A16 of the semiconductor memory 500 may be coupled to the power supply voltage 502 or the ground voltage 501.

According to the embodiment 3, even when the semiconductor devices 200 and 300 small in pin number are used instead of the semiconductor device 100 large in pin number, they can be coupled to the semiconductor memory 500. In this case, the positional relationship between the semiconductor device and the semiconductor memory becomes always constant regardless of the number of pins in the semiconductor device. Thus, it is possible to provide the semiconductor device excellent in usability. Even in the case where, for example, when the final electronic apparatus with the semiconductor device built therein is low in function, the semiconductor device 300 using a lesser-pin package is used, and when the final electronic apparatus is high in function, the semiconductor device 100 using a multiple-pin package is used, the board BOD with the semiconductor device mounted thereon remains unchanged in terms of the positional relationship between the semiconductor memory and the semiconductor device. Therefore, it becomes easy to redesign the wirings in the board BOD.

Then, as with the embodiment 2 even in the case where the semiconductor memory 500 is not used, a reduction in the number of bits of each port to which the microcontroller CPU can get access at a time can be minimized even if the semiconductor chip CHP is stored in the lesser-pin package. Besides, sufficient current driving capability can be obtained. Further, even if the number of pins varies, the ports can be gathered on one side of the semiconductor device without being dispersed. Therefore, there can be provided a semiconductor device excellent in usability.

Incidentally, although the embodiment 3 has been described using the semiconductor memory 500, the semiconductor memory 500 may use ports at which the number of bits is preferentially maintained, as for the interface with a semiconductor device in which another semiconductor device, e.g., a USB (Universal Serial Bus) physical layer is integrated. The semiconductor device to be interfaced is not limited to the semiconductor memory.

Further, in the embodiments 1 to 3, the ports thereof may be shared with other functions. Although there is shown in FIG. 3, for example that the ports are used in common for the memory interface circuit MIF, the ports are not limited to such sharing and can be shared with various ones.

Applications examples of the ports exist in various ways. Although the embodiment 3 has shown the example in which the ports are used as for the interface with the semiconductor memory, many application examples exist even other than that. For example, a plurality of LEDs are coupled to the ports of the semiconductor device and driven to thereby display time, temperature, etc. Alternatively, there is known an example in which a plurality of switches, e.g., ten keys are provided outside the semiconductor device and the state of the ten keys is read into the semiconductor device through the ports, followed by being processed by the microcontroller CPU.

As described in the embodiments 1 to 3, the semiconductor device has a plurality of ports. As described in FIG. 3, the input register IR and the output register OR are provided for the ports. Therefore, when the microcontroller CPU performs input or output on one port, it is capable of performing it by one access. When, however, a plurality of ports are used, the microcontroller CPU needs to access a different register (input register IR or output register). Further, the number of times of accesses increases and usability is degraded. For example, when a time display is done using an LED provided outside, it is considered that a plurality of ports are used when the number of bits of each port is insufficient. In this case, for the time display, the microcontroller CPU needs to access the ports and switch the time to be displayed.

When, for example, an interruption occurs in the microcontroller CPU in the middle of switching the display time, it is considered that the processing of the microcontroller CPU is branched into an interrupt routine in the middle of the display switching and hence the display of part of the LEDs is brought into the state before the switching, thereby causing a period during which an intended display is not obtained. On the other hand, if the processing of interrupt inhibition is performed during the display switching or the display switching is being made after the branching into the interrupt routine, it is necessary to devise a program that causes the microcontroller CPU to execute, such as preferentially executing the display switching.

In contrast, according to the embodiments 1 to 3, even when the semiconductor device small in pin number is provided, it is possible to suppress a reduction in the number of bits of each port at which the input or output is taken temporally in parallel by one access. Therefore, it is possible to provide a semiconductor device excellent in usability.

On the other hand, it is desirable that in order to reduce the cost of the board BOD with the semiconductor device mounted thereon, the board BOD is configured as a single layer board or a multilayer wiring board as small in layer number as possible. In this case, it is desirable that the ports of the semiconductor device and the components like the semiconductor memory are coupled by wirings of the single layer board or wirings of the same layer. In order to do so, it is desired to gather the ports on part of the pins of the semiconductor device.

On the other hand, it is common to store the semiconductor chip CHP of the same configuration in each package different in pin number and shape on the basis of the semiconductor chip CHP and provide the semiconductor device by type development. When the semiconductor chip CHP is stored in the package small in pin number, it is difficult to couple the continuously-arranged electrode pads to the leads by the wires due to manufacturing constraints such as the approach angle $\phi$.

According to the embodiments 1 to 3, the first port (e.g., P0) is comprised of the second port (P0-1) and the third port (P0-2). The second electrode pads which configure the second port, and the third electrode pads which configure the third port, are arranged along the side of the semiconductor chip CHP. The fourth electrode pads which configure the ports, are arranged between the second electrode pads and the third electrode pads. When providing the semiconductor device small in pin number, the fourth electrode pads and the leads are not coupled to each other, and the second electrode pads and the leads, and the third electrode pads and the leads are respectively coupled to each other. Thus, since the fourth electrode pads and the leads arranged in the central portion of the side do not need to be coupled by the wires upon providing the semiconductor device small in pin number, the approach angle $\phi$ can be prevented from being reduced.

Further, since the second electrode pads and the third electrode pads arranged continuously can be coupled to their corresponding leads along the side of the semiconductor chip CHP, the ports can be gathered on part of the pins of the semiconductor device. It is thus possible to provide the semiconductor device capable of achieving a reduction in the cost of the board BOD by type development.

Incidentally, in the embodiments 1 to 3, since the electrode pads C1a and C2a to which the reset input terminal C1 and the clock input terminal C2 are coupled, are also arranged in the central portion of the side E3 of the semiconductor chip CHP, the approach angle $\phi$ can be prevented from being reduced upon coupling them to their corresponding leads by the wires.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device comprising:
    a semiconductor chip including a main surface surrounded by a plurality of sides, and a plurality of electrode pads arranged over the main surface; and
    a plurality of leads coupled to the electrode pads by way of a plurality of wires respectively,
    wherein the plurality of electrode pads include a plurality of first electrode pads supplied with a plurality of bits in parallel,
    wherein the plurality of first electrode pads include second and third electrode pads, and
    wherein a fourth electrode pad different from the plurality of first electrode pads is arranged between the second and third electrode pads.

2. The semiconductor device according to claim 1, wherein the second, third and fourth electrode pads are arranged along one of the plurality of sides.

3. The semiconductor device according to claim 2, wherein the semiconductor chip is equipped with an internal circuit which generates the plurality of bits, and
    wherein the plurality of bits are supplied from the internal circuit to the second and third electrode pads in parallel.

4. The semiconductor device according to claim 2, wherein the plurality of bits are supplied from the outside of the semiconductor device to the second and third electrode pads in parallel.

5. The semiconductor device according to claim 2, wherein the fourth electrode pad is one of a plurality of fourth electrode pads, and
    wherein the fourth electrode pads are supplied with a plurality of bits in parallel.

6. The semiconductor device according to claim 2, wherein the fourth electrode pads includes an electrode pad supplied with a power supply voltage.

7. The semiconductor device according to claim 2, wherein the first electrode pads are arranged along the one side are all coupled to the leads by a plurality of wires.

8. The semiconductor device according to claim 6, wherein the second and third electrode pads arranged along the one side are respectively coupled to the leads by a plurality of wires, and
    wherein the fourth electrode pads arranged along the one side have electrode pads coupled to the leads by a plurality of wires, and electrode pads which are not coupled to the leads.

9. The semiconductor device according to claim 3, wherein the internal circuit includes a plurality of registers corresponding to the plurality of bits, and
    wherein the registers are coupled to the second and third electrode pads.

* * * * *